(12) United States Patent
Liu et al.

(10) Patent No.: US 7,425,740 B2
(45) Date of Patent: Sep. 16, 2008

(54) METHOD AND STRUCTURE FOR A 1T-RAM BIT CELL AND MACRO

(75) Inventors: Sheng-Da Liu, Hsin-Chu (TW);
Hung-Wei Chen, Hsin-Chu (TW);
Chang-Yun Chang, Taipei (TW);
Zhong Tang Xuan, Kaohsiung (TW);
Ju-Wang Hsu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 475 days.

(21) Appl. No.: 11/246,318

(22) Filed: Oct. 7, 2005

(65) Prior Publication Data

US 2007/0080387 A1    Apr. 12, 2007

(51) Int. Cl.
*H01L 27/108* (2006.01)
*H01L 29/76* (2006.01)
*H01L 29/94* (2006.01)
*H01L 27/01* (2006.01)
*H01L 27/12* (2006.01)

(52) U.S. Cl. ................................ 257/306; 257/347
(58) Field of Classification Search .......... 257/295–310
See application file for complete search history.

(56) References Cited

U.S. PATENT DOCUMENTS

| | | | |
|---|---|---|---|
| 5,918,148 A | 6/1999 | Sato | |
| 6,413,802 B1 | 7/2002 | Hu et al. | |
| 6,420,226 B1 | 7/2002 | Chen et al. | |
| 6,436,787 B1 | 8/2002 | Shih et al. | |
| 6,528,422 B1 | 3/2003 | Huang et al. | |
| 6,620,679 B1 | 9/2003 | Tzeng et al. | |
| 6,638,813 B1 | 10/2003 | Tzeng et al. | |
| 6,656,785 B2 | 12/2003 | Chiang et al. | |
| 6,656,786 B2 | 12/2003 | Chiang et al. | |
| 6,661,043 B1 | 12/2003 | Huang et al. | |
| 6,670,664 B1 | 12/2003 | Tzeng et al. | |
| 6,682,982 B1 | 1/2004 | Tu et al. | |
| 6,720,232 B1 | 4/2004 | Tu et al. | |
| 6,720,619 B1 | 4/2004 | Chen et al. | |
| 6,998,676 B2 * | 2/2006 | Kondo et al. | ................. 257/329 |
| 2004/0159834 A1 | 8/2004 | Huang et al. | |

OTHER PUBLICATIONS

Yang, et al., "High-Density MIM Capacitors Using AlTaO$_x$ Dielectrics," IEEE Electron Device Letters, vol. 24, No. 5, May 2003, pp. 306-308.

(Continued)

*Primary Examiner*—Cuong Q Nguyen
(74) *Attorney, Agent, or Firm*—Slater & Matsil, L.L.P.

(57) ABSTRACT

A one transistor (1T-RAM) bit cell and method for manufacture are provided. A metal-insulator-metal (MIM) capacitor structure and method of manufacturing it in an integrated process that includes a finFET transistor for the 1T-RAM bit cell is provided. In some embodiments, the finFET transistor and MIM capacitor are formed in a memory region and an asymmetric processing method is disclosed, which allows planar MOSFET transistors to be formed in another region of a single device. In some embodiments, the 1T-RAM cell and additional transistors may be combined to form a macro cell, multiple macro cells may form an integrated circuit. The MIM capacitors may include nanoparticles or nanostructures to increase the effective capacitance. The finFET transistors may be formed over an insulator. The MIM capacitors may be formed in interlevel insulator layers above the substrate. The process provided to manufacture the structure may advantageously use conventional photomasks.

26 Claims, 19 Drawing Sheets

OTHER PUBLICATIONS

Yang, et al., "Excimer Laser Manipulation and Pattering of Gold Naoparticles on the $SiO_2$/Si Surface," Journal of Applied Physics, vol. 95, No. 9, May 1, 2004, pp. 5023-5026.

Ding, et al., "High-Performance MIM Capacitor Using ALD High-*k* $HfO_2$-$Al_2O_3$ Laminate Dielectrics," IEEE Electron Device Letters, vol. 24, No. 12, Dec. 2003, pp. 730-732.

Leung, et al., "The Ideal SoC Memory: 1T-SRAM™," IEEE, 2000, pp. 32-36.

Zhou, et al., "Formation of Self-Assembled Epitaxial Nickel Nanostructures," Journal of Applied Physics, vol. 94, No. 8, Oct. 15, 2003, pp. 4841-4846.

Ge, et al., "Process-Strained Si (PSS) CMOS Technology Featuring 3D Strain Engineering," IEDM, 2003, pp. 73-76.

Weber, et al., "55nm High Mobility SiGe(:C) pMOSFETs with $HfO_2$ Gate Dielectric and TiN Metal Gate for Advanced CMOS," Symposium on VLSI Technology Digest of Technical Papers, 2004, pp. 42-43.

Iwamoto, et al., "A High Manufacturable Low Power and High Speed HfSiO CMOS FET with Dual Poly-Si Gate Electrodes," IEEE, 2003, 4 pgs.

Shima, "<100> Strained-SiGe-Channel p-MOSFET with Enhanced Hole Mobility and Lower Parasitic Resistance," Fujitsu Sci. Tech. J., vol. 39, No. 1, Jun. 2003, pp. 78-83.

* cited by examiner

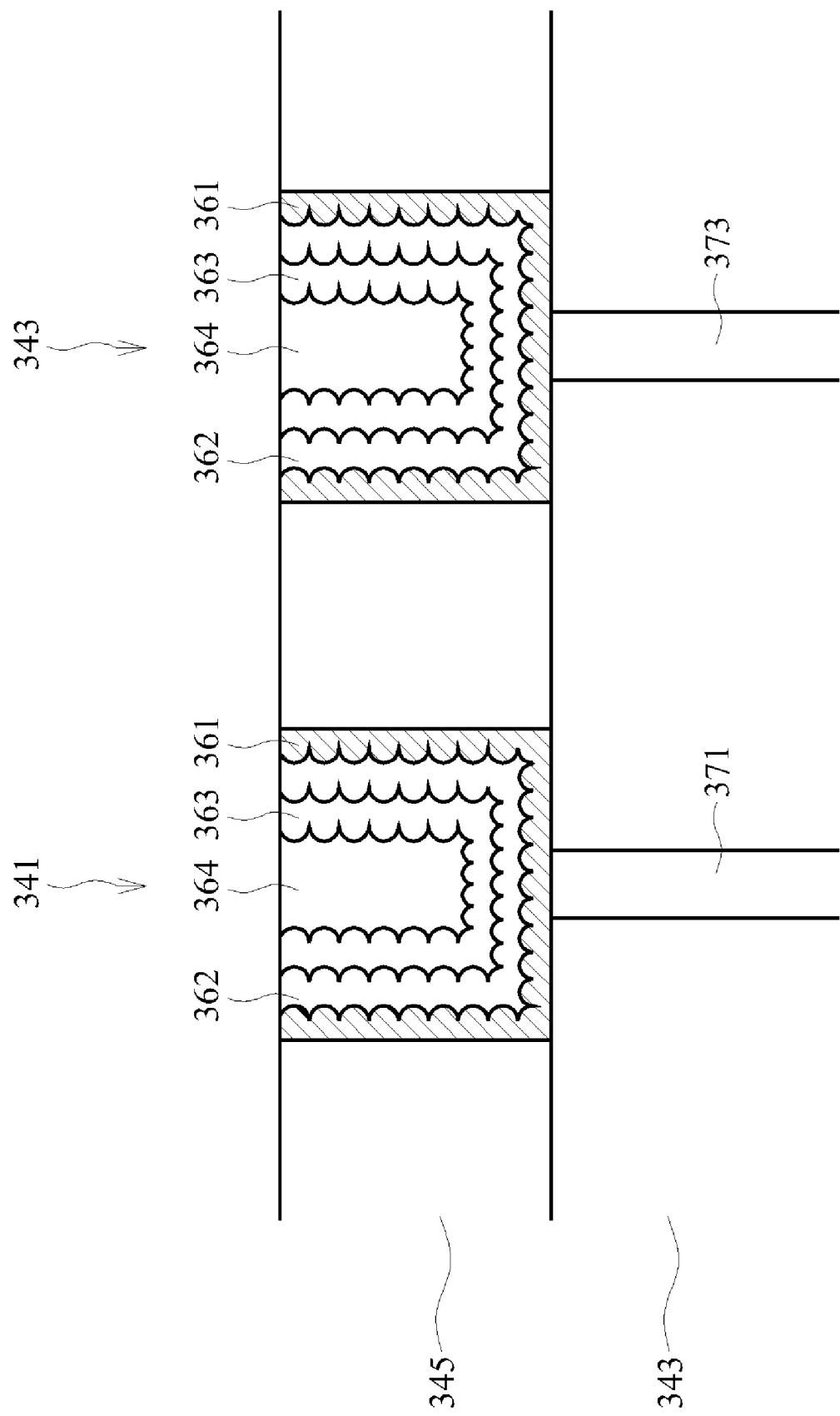

METHOD AND STRUCTURE FOR A 1T-RAM BIT CELL AND MACRO

TECHNICAL FIELD

The present invention and the various embodiments described generally relate to the fabrication of semiconductor devices, and more particularly to fabricating integrated devices which incorporate planar MOS transistors, one or more MIM (metal-insulator-metal) storage capacitors, and/or one or more finFET transistors to form a memory storage cell, such as a one transistor bit cell, and macro cells including one or more of said memory storage cells.

BACKGROUND

In the semiconductor art, it is desirable to add RAM storage onto an integrated circuit which also comprises other circuitry, for example, for microprocessor circuits (MPUs,) microcontroller circuits (MCUs), digital signal processors (DSPs), RF or filter circuitry which uses stored data or parameteric information, analog-to-digital converters and the like, or other advanced circuitry which requires data or program storage to be rapidly accessible by programmable or logic circuitry. In the prior art this need is addressed by so-called "embedded" RAM circuits which may comprise multiple transistor SRAM cells, or transistors plus capacitive storage cells, and sometimes storage cells, each cell formed from one transistor and a capacitor, so-called "1T" RAM bit cells. For example, the paper entitled "The Ideal SoC Memory: 1T-SRAM", Leung et al., published in the Proceedings of the Annual IEEE International ASIC Conference and Exhibits, 2000, pp. 32-36, describes the use of a one transistor storage cell having a capacitor and using transparent (hidden) refresh techniques to implement a "SRAM" cell.

In a semiconductor device with embedded RAM circuits, the device may be divided into different areas so that compatible, but differing, process steps and materials may be used to implement devices having different physical characteristics. For example, a biCMOS semiconductor device peripheral circuitry, which includes large driver circuits, may incorporate bipolar transistors for the driving buffers while the internal or core logic circuitry may be only CMOS technology, which is implemented in a planar technology. In other known processes, other embedded circuitry may be fabricated as SOI (silicon-on-insulator) or SIMOX devices, which lie above the planar circuitry, which is formed at the surface of the silicon substrate. Such integrated or embedded technologies are required to implement the systems on an integrated circuit (SOICs) or systems on a chip (SOC), or the highly integrated microprocessors and signal processors that are currently being designed or which will be designed in the future.

Capacitors are elements that are used in semiconductor devices for storing electrical charge. The presence of certain levels of stored charge, or the absence of the stored charge, may represent data values, for example, data values '0' and '1' are used in a typical binary circuit. In a semiconductor memory device, or in a portion of a semiconductor integrated circuit including an embedded memory array, a capacitor may be used as a data storage element which is read and/or written by an access transistor which couples the capacitor storage element to bit lines which may be used to supply write data for storage, or in a read mode, sense the stored charge and interpret that as read data. In some memory arrays the transistor and capacitor are arranged to form a 1T-RAM bit cell. The most desirable form of memory storage is "static" or SRAM, many different cells can be fabricated as SRAM cells, however, these cells require usually 6 or even 8 transistors to implement, which take up substantially more area than a similar capacitive storage cell. The capacitor may have to be periodically refreshed by reading the cell and writing back the charge stored, in this case the cell is typically referred to as a "dynamic" RAM or DRAM cell. If, however, a capacitor can be used in a 1T-RAM bit cell where the capacitor refresh is required so infrequently as to allow it to be hidden from the user by automatic on-board circuitry and performed during other operations (a so-called "hidden" or "transparent" refresh), it may be referred to as "pseudo-static" RAM cell or just a 1T-RAM (one transistor RAM) bit cell.

1T-RAM bit cells have a great advantage over multiple transistor SRAM cells in that the area used to implement them is small, so that a much greater amount of memory may be provided in a small silicon area. This cell area advantage is particularly important in embedded RAM arrays for system on a chip (SoC or SOIC) or application specific IC (ASIC) applications. U.S. Pat. No. 6,638,813, entitled "Method of Forming a Composite Spacer to Eliminate Polysilicon Stringers Between Elements in a Pseudo SRAM Cell," to Tzeng et al.; U.S. Pat. No. 6,528,422, entitled "Method to Modify 0.25 µM 1T-RAM by Extra Resist Protect Oxide (RPO) Blocking", to Huang et al.; and U.S. Pat. No. 6,420,226, entitled "Method to Defining a Buried Stack Capacitor Structure for a One Transistor RAM Cell," to Chen et al.; each incorporated herein by reference, and each assigned to the assignee of the present invention, describe various 1T-RAM bit cells using capacitor storage elements.

Macro cells may be created which include 1T-RAM bit cells and other logic circuitry such as drivers, buffers, clock fan out circuits, and other peripheral circuitry which does not require capacitors; the transistors used in these other related circuits may be the same or different from the storage cells; these macro cells are organized together to form a functional circuit so as to form application specific integrated circuits (ASICs) by circuit designers, by providing predetermined functions in the form of proven and reusable macro cells, the design time required for designing an integrated circuit performing a new or modified function is significantly reduced. Macro cells can be as simple as a few transistors, or as complex as an embedded RAM, ROM, flash or EEPROM array, a register file or FIFO, or a macro cell may be a complete DSP device including embedded ROM and RAM and a programmable processor.

Capacitors in semiconductor devices are formed by providing at least two conductive plates separated by an insulator or dielectric layer, or sometimes separated by multiple layers of insulating material. The capacitance, or the measure of the amount of charge that will be held by the capacitor for an applied voltage potential across the plates, will depend on many parameters such as the area of the plates, the distance between the plates, and the dielectric constant value for the insulator between the plates, as examples. In addition to their use as a storage element, capacitors embedded on integrated circuits have many other applications, including as an element in RC networks, for filtering circuits, for analog-to-digital and digital-to-analog converters, for switched capacitor networks, and they may be used with any other circuit arrangement which uses capacitance as a circuit element.

One particularly important type of storage capacitor is a metal-insulator-metal (MIM) capacitor. This capacitor is formed from a stack of materials including a metal or polysilicon first electrode or plate, an insulator which may incorporate various dielectrics including high-k dielectric materials, and a second electrode or plate which again may be a metal or polysilicon material. An advantage of a MIM capacitor for integration for embedded applications is that the MIM capacitor can be formed in the interlevel insulator layers above the silicon substrate, so that the MIM capacitor may be efficiently provided without consuming valuable active device area on the substrate itself, instead the MIM capacitor may be provided in the area overlying the substrate so that planar MOS transistor devices may be placed underneath it, or if an SOI or SIMOX approach is used, even above it. Often, at least one of the conductive plates is formed in a metallization layer or metal interconnect layer of the semiconductor device. Another capacitor plate may be formed in the polysilicon or "poly" layers which are typically formed closer to the surface of the substrate; of course the MIM capacitor can be formed in layers far above the substrate as well. Planar or "in substrate" capacitors are also known in the art. U.S. Pat. No. 6,720,232, to Tu, et al., entitled "Method of Fabricating an Embedded DRAM for Metal-Insulator-Metal (MIM) Capacitor Structure," assigned to the assignee of the present invention and also hereby incorporated by reference, describes one method for forming MIM capacitors in the interlevel insulator layers above the substrate for RAM bit cells.

It is known in the prior art that the capacitance of an integrated capacitor may be increased if the effective area of the plates is increased by texturing the plates. Various materials and techniques are known to create rough, or textured surfaces for use in a capacitor, for example, so-called HSG or hemispherical grain material may be created by a deposition and special anneal or by chemically treating or etching a material after it is deposited. These approaches may be applied to a MIM capacitor.

Performance of a capacitor may be further enhanced by the use of various so-called high-k dielectrics in the insulating layer, for example. The dielectric conventionally used in the semiconductor art is silicon dioxide, which has a dielectric constant "k" of 3.9. Dielectrics with a dielectric constant greater than 3.9 are therefore referred to as "high-k" dielectrics. A paper entitled "High-Performance MIM Capacitor using ALD High-k $HfO_2$—$Al_2O_3$ Laminate Dielectrics," Ding et al, IEEE Electron Device Letters, Vol. 24, No. 12, December 2003, pp. 730-732, for example, describes a MIM capacitor with a dielectric formed by two materials, hafnium oxide ($HfO_2$) and aluminum oxide ($Al_2O_3$), which are in a laminated "sandwich" of thin layers to using atomic layer deposition (ALD) techniques. A paper entitled "High-Density MIM Capacitors using $AlTaO_x$ Dielectrics", Yang et al., IEEE Electron Device Letters, Vol. 24, No. 5, May 2003, pp. 306-308, similarly describes desirable results using aluminum tantalum oxide dielectric material in a MIM storage capacitor for integrated circuits.

A prior art semiconductor device 100 including a MIM capacitor storage bit cell is shown in a cross section (drawn for illustration, and no figures in this description are to scale and should be considered as descriptive only) in FIG. 1. The semiconductor device 100 includes a substrate 101 having a memory region and a logic region. The substrate may be, for example, a silicon substrate having a 100 or other known crystal orientation, a silicon-germanium substrate (SiGe) or other substrates known and used in the semiconductor art. The silicon substrate could be a layer of silicon deposited or grown over an insulator in a silicon-on-insulator (SOI) process, for example.

The substrate has doped well areas formed within it, N-type wells 103 and P-type well 105 are shown in FIG. 1. These doped wells may be formed using various known semiconductor processing steps, including an ion implant of the doping ions followed by a thermal anneal, or known other process steps may be used. These wells could be formed before the other features shown in the cross section, or using a high energy through-layer implant of ions through layers, after deposition of the gate dielectric layer, for example. One or more elements in group V on the periodic table can be used as dopants for the N-well, as is known in the art, on one or more elements of group III in the periodic table can be used as dopants for the P-well, also as is known in the art. Inert material can also be implanted to improve the electrical characteristics of the devices as is known in the art.

Shallow trench isolation regions 107 are formed within the substrate and have a depth somewhat less than the depth of the wells 103 and 105. As is known in the prior art, shallow trench isolation regions or STI provide many advantages including electrical isolation of the semiconductor regions separated by the STI regions. Shallow trench isolation regions 107 are filled with an insulating material which may be, for example, a high density plasma oxide (HDP) material.

A plurality of transistors are formed in and over the substrate 101, transistors 113 and 115 in the logic region form planar MOS transistors, which may be used for a variety of logical and electrical functions. Transistor 113 is a P-channel device having a source and drain region formed in the N-well 103 and separated by a channel covered with a gate dielectric or oxide, and transistor 115 is an N-channel device formed in P-well 105 having a source and drain region separated by a channel covered with a gate dielectric or gate oxide. Each transistor 113 and 115 also has a polysilicon or metal gate terminal, and in FIG. 1 the source, drain and gate regions are all shown with a resistance lowering Cobalt salicide layer overlying, or strapping, the source, drain and gate conductors, this is an optional feature which will result in better device performance. STI region 107 provides a connectivity site for conductive metal layer 151 to contact the polysilicon conductor 111 by means of a via stack 131 formed in interlevel oxide layers 153, 155 and 157. Conductive metal layer 149 is coupled electrically to the N-channel planar transistor 115 by a via stack 129 extending through interlevel oxide layers 153, 155, and 157. Transistors 113 and 115 are a P and N-channel pair of CMOS logic transistors and may form an inverter, for example, but may also be used separately or used as diodes, pass transistors or for other functions as is known in the art by changing the connections made at the metallization layer.

Transistor 119 formed in N-well 103 in the memory region comprises the access transistor of the RAM storage cell shown in the figure. Although a single access transistor and a capacitor are shown in the figure, a practical device might have many thousands of these cells in a typical arrangement. Storage MIM capacitor 121 is formed above the substrate in the interlevel oxide layers 155 and 153 and has a contact plug 123 through interlevel oxide 157 which provides electrical contact to a source/drain region of the P-channel transistor 119. The capacitor is a metal-insulator-metal (MIM) or metal-insulator-semiconductor (MIS) capacitor formed as a vertical capacitor as shown. Contact plug 123 provides electrical contact to the bottom plate of the MIM and via 133 forms electrical contact to the top plate of the MIM, which is coupled electrically to conductive metal layer 143.

The prior art device depicted in FIG. 1 provides planar logic transistors and an embedded memory circuit within a single integrated circuit device. The process steps for making the prior art device of FIG. 1 will now be briefly described.

FIG. 2 depicts a step early in the process of manufacturing the embedded memory cell shown in FIG. 1. In FIG. 2, substrate 101 is shown, again in an illustrative cross-section and not drawn to scale. Substrate 101 is a conventionally used silicon monocrystalline substrate. Other known semiconductor substrate materials may be used. Substrate 101 may be a bulk silicon substrate, or a silicon-on-insulator (SOI) region deposited over an insulator. In the example shown, the substrate 101 is a P-type material, other substrate types known to the art may be used. A layer of pad oxide 102 is formed on substrate 101. Typically, pad oxide 102 is a conventional pad oxide material such as silicon dioxide and may be grown or deposited, other approaches may be used such as composite oxide including TEOS and silicon dioxide or nitride oxide, or a gate dielectric. The pad oxide 102 may be, for example, thermally grown in an oxygen-steam ambient at a temperature between 800 and 1,000 degrees C. The pad oxide may be a variety of thicknesses, for example, it may be a thickness of from about 30 to about 300 Angstroms. Other oxidation processes could be used to produce the pad oxide including oxidation in a dry oxygen and anhydrous hydrogen chloride, in high or low pressure environments, and in high or low temperature environments. Rapid thermal oxidation may also be used.

Layer 104 is a nitride layer formed over the pad oxide 102. Layer 104 is, for example, of silicon nitride ($Si_3N_4$) and can be deposited using conventional deposition for nitride layers, including LPCVD or PECVE procedures, for example, at pressures between about 300 milliTorr and 400 milliTorr at a temperature between about 400 and 800 degrees C. using gases such as $NH_4$ and $SiH_4$ as reactants. Alternative approaches include using LPCVD and PECVD equipment, using as reactants other gases such as dichlorosiliane ($SiCl_2H_2$) and ammonia ($NH_3$).

In FIG. 3, the shallow trench isolation regions (STI) 107 are depicted as initially formed by a conventional etching process after a conventional photolithographic patterning step (not shown) is used. For example, plasma etching may be used to remove the nitride, pad oxide and etch the substrate in regions 107. In a plasma etch process, as is conventionally known in the art, a first electrode is provided in a processing chamber of a conventional plasma etch reactor and the substrate is positioned upon the electrode. A second electrode is provided which is spaced apart and is opposite from the first, for example, the second electrode may be in or attached to the lid of the processing chambers, although other arrangements are also used. A gaseous medium for the plasma is flowed through the chamber and energy in the form of a radio frequency or RF voltage, which may include components having various frequencies, is applied across the two electrodes to create a gaseous discharge that ionizes the medium and forms a plasma, the ions bombard and etch the wafer. The gases and RF frequencies may be varied, as is known in the art, to produce a highly selective and anisotropic etch. Typically, a dry etch is used where the wafer is exposed to etchant gases in the plasma chamber including, for example, $CF_4$, $CHF_3$ (Freon), $SF_6$ of $NF_3$. Other gases such as $N_2$, $O_2$ and Ar may be used. The depth of the STI trench can vary, however, depths of 1000 to 5000 Angstroms are used.

FIG. 3 depicts the substrate 101 after the STI regions are filled with a trench oxide 106. Trench oxide 106 can be formed conventionally by CVD of silicon dioxide filling the trenches 107 and further overlying the remaining nitride layer. Alternatively, PECVD deposition may be used to form oxide layer 106. The trench oxide may be formed in a PECVD reaction chamber using temperatures from about 200 to 350 degrees C., for $SiH_4/O_2$ or $SiH_4/N_{20}$ precursors. The thickness of the trench oxide layer is variable but may be, for example, about 3000-5000 Angstroms.

FIG. 3 depicts substrate 101 after the excess trench oxide is removed from the STI trenches and the substrate by chemical mechanical polishing, or CMP. In CMP, the material is removed and the surface is planarized exposing the surface to a polish or grit material which is applied with rotation and pressure to remove the excess material. Other conventional CMP steps can be used as is known in the art. The oxide layer 106 is removed to a certain desired thickness, nitride layer 104 is removed to leave a desired amount of oxide layer 106 in the STI regions above the surface of substrate 101.

In FIG. 3, the substrate is shown after the deposition of gate dielectric layer 122 and gate electrode material for electrodes 111, 113, 115, 117, 119; and following the pattern and etch to form the individual gate electrodes having sidewalls. Conventional methods are used to deposit a gate oxide or gate dielectric over the substrate and the trench isolation regions, the gate polysilicon is deposited over the gate oxide, a patterning step is performed to form protected and non-protected areas, and conventional etching steps are used to remove the gate conductor material and the gate oxide material in the non-protected areas, the hardmask or hardened photoresist is then removed from the gate and polysilicon conductors to form the structure shown in FIG. 3. For example, the gate oxide formation may result in an $SiO_2$ layer that is from 20 to 70 Angstroms thick.

Following the formation of the gate oxide or dielectric, polysilicon or metal gate conductor material is deposited over the oxide to form the gate electrode layer, this may be a layer of polysilicon with a thickness of from about 1500 to about 2500 Angstroms thick. This polysilicon layer and the underlying gate dielectric are then patterned using conventional photomask and photoresist steps as known in the art and the unnecessary material is removed leaving the gate conductors 113, 115 and 119 and their underlying gate oxides, as well as the polysilicon level conductors 111, 115 and 117. The gate electrodes overlying the trenches will not, of course, act as device gates in the region shown in the cross section, as they lie over the trench isolation regions and not active area, but instead they provide connectivity areas at the polysilicon level to allow other levels of conductors to be connected to the gate polysilicon layer.

In FIG. 4, an important processing step is shown for producing the memory area of the integrated circuit. Because the logic section of the device may have, if desired, certain different physical characteristics than that of the memory section, a photomask (not shown) is used to produce a protective patterned photoresist layer 112 over the logic region area, prior to the implant for the lightly doped drain and source diffusions 114 of the memory area, this implantation step is shown in FIG. 4. The protective layer 112 is formed using a photomask sometimes known as the cell lightly doped drain mask, or "CLDD" mask, and is used to form the photoresist coating 112 that protects the logic area devices during the cell lightly doped drain implant steps. After source and drain doping for the memory area of the device is complete, a second similar photomask will be used to form a photoresist layer (not shown) over the memory area and to protect the memory area while a lightly doped drain diffusion using different ion implantation energies and/or different doping materials will be performed in the logic area of the device. This asymmetric photolithographic processing approach enables the memory area and the logic area transistors of a single device to have optimal physical characteristics that are different for the two regions in a single, compatible process for manufacture. In particular, the two regions are subjected to separate and different ion implantation steps for the source and drain lightly doped implants.

As the gate polysilicon electrodes are formed prior to the source and drain region implants, the gates are said to be self-aligned, the gate electrodes 113, 115 and 119 form part of the mask over the substrate which defines the source and drain regions during the implant steps, as is conventionally known. In N-well areas, P-type implants which may be used are conducted to concentrations of preferably from about $1\times10^{-14}$ to about $5\times10^{-15}$ atoms/cm$^2$ and at an energy from about 2 to about 5 keV to form P-type regions, using dopants such as boron (B) and/or BF$_2$. Implants may be performed at a perpendicular angle to the substrate, or as is conventionally known, some implants may be pocket implants where the substrate is rotated and tilted to achieve a successful implant. N-type implants into P-well areas may be performed, using dopants such as As (arsenic) or Ph (phosphorous) to achieve a concentration such as from about $1\times10^{13}$ to $5\times10^{13}$ atoms/cm$^3$ to a depth of about 500 to about 1200 Angstroms, using an energy of about 2 to about 5 keV for perpendicular implants, and for deeper or pocket implants, using an energy of about 100 to about 150 keV.

FIG. 5 depicts the substrate 101 following the completion of the transistors in both the memory and logic areas, the deposition of some interlevel insulation layers and the first steps in forming the capacitor over the substrate. Conventional ion implant and anneal steps have been performed to create the source or drain regions 114 for the planar transistors having gates 113, 115 and 119. Sidewall oxide 124 is shown deposited on the gates 113, 115 and 119. This oxide is produced by conventionally known deposition steps, for example, SiO$_2$ is deposited using conventional deposition techniques, such as rapid thermal oxidation. The sidewall oxides may be formed from nitride, silicon nitride, oxide, silicon oxide, silicon oxynitride or composites such as ONO or NO composites.

FIG. 5 depicts the substrate 101 following formation of the gate sidewall regions 124 on the sidewalls for transistors having gate electrodes 113, 115 and 119 and following the deeper source/drain implants which complete the source and drain regions 114. Thus, the source and drain regions 114 each have a shallow area underneath the sidewall oxides which are adjacent and part of a deeper source drain region produced by conventional ion implantation and dopant anneal steps. These steps are conventional and well known to those skilled in the art.

FIG. 5 depicts the substrate 101 following the metal salicidation step and after a conformal layer of protective oxide is formed over the completed transistors having gates 113, 115, and 119 and polysilicon conductors 111, 117. As is known in the conventional art, resistance of conductive materials deposited on a substrate may be lowered by performing a self aligned silicidation, or salicidation, step over the materials. Conventional steps are used to form the salicidation layer 130 which is indicated as coating gates 113, 115 and 119 and source and drain regions 122, as well as the top surface of conductors 111 and 117 in FIG. 10. A metal layer is formed over the structure and heated to form silicide over the exposed polysilicon gates and conductors of FIG. 9, as well as the source and drain implant areas. The silicide structures 130 are preferably formed of cobalt silicide by applying a coating of cobalt and heating it, or forming Co-salicide, and/or titanium silicide by applying a coating of titanium and heating it, or Ti-salicide, other salicidation steps known and conventionally used may be performed. Following the salicidation step, a protective oxide conformal layer 126 is formed over the structure.

Following the formation of the transistors with gate electrodes 113, 115 119, interlevel insulation layers are formed to enable multiple metal layers, coupled by vias, to complete the device and allow for interconnections between metal layers.

A capacitor 121 will be formed in the second layer of insulation in a recess. The process steps for forming the capacitor are as follows.

FIG. 5 depicts substrate 101 after a first insulating layer 157 is formed. Insulating layer 157 is deposited over the protective layer 126 and is initially fairly thick, from about 3000 to 5000 Angstroms, and may be deposited using conventional methods such as RTO, CVD, materials may include any number of known insulating layers such as, for example, CVD silicon dioxide, PSG, BPSG, high density plasma deposited oxide or others. Following this thick deposition, the layer 157 is machined to a thinner dimension and planarized using CMP techniques, as is known in the art and described above, and the layer 157 may then be further thinned by etching back using, for example, a plasma dry etch or further finely controlled CMP techniques. After CMP the layer 157 may be, for example, about 3000 Angstroms thick and the final thickness after the etch back may be, for example, about 600 to 1400 Angstroms over the gate electrodes 113, 115 and 117.

Following the deposition, CMP and etch back steps or other process steps to form layer 157, tungsten plugs 129, 131, 133, 135 and 137 are formed to contact the polysilicon conductors and gate electrodes and source or drain regions shown in FIG. 5. To form the tungsten plugs, conventional techniques are used. A stop layer, not shown, is formed over the insulator layer 157. This layer may comprise silicon nitride or silicon oxynitride, for example. Contact openings are etched into through the stop layer and the insulating layer and contacts are opened in the protective oxide 126 over polysilicon 111, 113, 115, 117, 119, source or drain regions 114 as shown in FIG. 5. The contact openings are then lined with a barrier material, also not shown, and filled with tungsten or another like material for conducting, which is deposited to fill the contact openings and extends onto the top surface of layer 157. The excess material is then removed again using CMP or a conventional etching technique to leave the structure of FIG. 5.

It is known in the art to form a MIM capacitor in the interlevel insulator layers by using a contact plug, here numbered 133, for example, as the electrical contact to the bottom plate of the capacitor later formed in a recess etched above the contact plug. In this particular example, the transistor having gate 119 will form a planar NMOS or PMOS type access transistor for the capacitor and the combination of the transistor and the capacitor (to be formed as described below) will form a 1T storage bit cell.

In FIG. 5 the substrate 101 is further depicted with a second level of insulator 155 formed. Layer 155 is formed using the same techniques as for insulator 157 although the thickness of this layer 155 may be more, and possibly much more, than that of layer 157, as the thickness of layer 155 will provide substantially for the vertical height of the capacitor and thus affect the values of capacitance that may be achieved. For example, layer 157 may be 3000-5000 Angstroms thick, or more or less for a given capacitor structure. After the second layer of insulator 155 is formed and planarized using CMP techniques, a stop layer (again not shown) of nitride or silicon nitride is formed over the oxide of layer 155 and contact holes are patterned and etched using conventional techniques, and vias contacting the via stacks 138, 136, 134 and 132 are opened and filled with tungsten plugs or like materials, to continue the vertical via stacks that contact the polysilicon layer and the source or drain regions. No opening is yet formed over the location of via 133, as that will be where the capacitor bottom plate is formed in the next steps.

FIG. 6 depicts the substrate 101 after the capacitor 121 is formed. Again the surface of layer 155 is patterned and etched to create the recess at 121, which will receive the bottom layer of the capacitor. The following steps complete the structure and describe the final steps in moving from FIG. 6 to the finished structure of FIG. 1. Capacitor 121 may be formed using a variety of conventional processing steps and materials. The bottom plate electrode may be formed, for example, by depositing tantalum nitride or titanium nitride conformally into the capacitor recess, the substrate is then subjected to a layer of photoresist over the conforming layer which is removed leaving only the TaN or TiN deposit within the recess, the top layer is stripped of photoresist and the deposited material. In a conventional process, the capacitor dielectric layer is then deposited which may be a high dielectric constant material and have a thickness of between 100 and 800 Angstroms, for example, and may include such dielectrics as tantalum oxide $Ta_2O_5$, aluminum such as $Al_2O_3$, hafnium, lanthanum, nitrides or the like, or conventional dielectrics such as silicon dioxide. Alternatively, a laminate of $HfO_2$—$Al_2O_3$ may be used and formed, for example, by atomic layer deposition (ALD) process steps as described in "High-Performance MIM Capacitor Using ALD High-k $HfO_2$—$Al_2O_3$ Laminate Dielectrics," Ding et al, IEEE Electron Device Letters Vol. 24, No. 12, December 2003, which is herein incorporated by reference.

It is also known to increase the effective capacitance from a capacitor structure by using hemispherical grain (HSG) polysilicon or other grainy materials as the bottom electrodes, the dielectric and top electrodes are then deposited over this material in a conformal manner, the resulting capacitor plate area is subsequently increased due to the granular surface and thus the resulting capacitance is increased without a corresponding increase in silicon die area. So these approaches can be used in making the capacitor 153, if desired.

The capacitor 121 includes a top plate, preferably formed of two layers, another titanium nitride (TiN) or tantalum nitride (TaN) layer is formed over the dielectric layer and then a copper top plate is then formed using damascene processes and extending into the third insulating layer 153 as shown, these steps are conventional and will not be further described in detail here.

To form these layers over the dielectric, a layer of conductive material, usually the same as the bottom electrode, such as TiN or TaN, is deposited. Annealing steps may be used to complete the bond between the TiN and the dielectric. A metal layer, for example, an aluminum or preferably a copper layer is now deposited over the top electrode and filling the recess and is shown extending into the third insulator layer 153 where it is patterned to complete the capacitor. The copper top layer may be formed by electroplating or deposit and is removed by CMP steps to planarize and complete the pattern, a dual damascene process may be used. The top layer of the capacitor is then covered by the third layer of insulator 153, which is deposited and again subjected to CMP planarization.

To complete the structure shown in FIG. 1, vias are formed at the same location as 138, 136, 134, 132, and 177. Again contacts are opened and filled with tungsten plugs to complete the via stacks through the three insulating layers up to the metal layer. Conductors 151, 149, 147, 145 and 143 are possibly aluminum conventionally deposited and patterned, alternatively copper damascene processing may be used if the conductors are copper which is becoming the standard in the conventional art.

So again returning to FIG. 1, substrate 101 is depicted with a completed prior art structure including the MIM capacitor 121 formed within the interlevel insulator layers. Layer 153 is deposited over layer 155 and has metallization conductors 151, 149, 147 and 154 formed for contacting the source, drain and gate electrodes coupled to the via stacks. Metal conductor 143 contacts capacitor 121 by a via 177 formed through the third level of insulator material. Capacitor 121 may be conventionally formed of a bottom electrode of TaN or TiN, a high-k dielectric material including tantalum oxide $Ta_2O_5$, $HfO_2$, $AlTaO_x$, may be used and formed conventionally by deposition and annealing steps. HSG or roughened polysilicon can be used to increase the plate area and the resulting capacitance.

In order to get the most storage possible in an embedded RAM area of an integrated circuit, the various devices used to implement the RAM need to be as small as possible and very densely packed. Therefore, in addition to the storage capacitors themselves, the area required by the transistors used to access the memory capacitor, the access transistors, is also important. However, as the size of conventional MOS transistors is reduced with the scaling reductions of the overall process technology, conventional planar MOS transistor structures start to become less desirable. As the channel width of a MOSFET transistor is reduced certain "short channel" effects may occur where the source and drain regions remain electrically coupled even when the device is off, these effects can result in undesirable or even unacceptable performance, or errors.

Recently, an alternative MOS transistor topology, the finFET transistor, has been developed, as described, for example, in U.S. Pat. No. 6,729,619, to Chen et al, assigned to the assignee of the present invention and which is incorporated by reference; finFET transistors are also described in U.S. Pat. No. 6,413,802, to Hu, et al, which is also hereby incorporated by reference. The finFET transistor has a source, drain and gate region formed from silicon or other semiconductor "fins" which may be fabricated over any substrate or over an insulator, so that the transistor channel is not formed at the substrate surface but instead may be placed in layers produced above the substrate. Because the channel may be formed over an insulator (silicon-on-insulator or SOI) instead of the bulk silicon used in the conventional planar topology, in some applications the short channel effect is eliminated. The typical finFET also has at least two gate regions (formed on the sidewalls on either side of the fin) which enhances the performance of the device for given device surface area. To increase current carrying capacity it is possible to add additional gate regions to a device and so various capacity transistors may be produced.

FIG. 7 depicts an illustrative three-dimensional view of a finFET transistor device as known in the art. The device may be implemented over an insulator, over bulk silicon, or over silicon 201, which may be placed on an insulating layer as for SOI or SIMOX.

Other substrate materials such as silicon germanium, SiGe, or germanium may be used, of course. In FIG. 7 substrate 201 is shown and a silicon "fin" is provided, here numbered 203. This fin 203 will form the source and drain regions of the completed transistor, and the channel will form in the region between the source and drain. Gate oxide or dielectric 205 is provided, deposited over the sides of fin 203, and as shown in this example, the top of the source drain fin region 203. Because the gate oxide is deposited over two sides of the source drain, the device has multiple gates and may be referred to as a "multi-gate" device. A gate electrode 207 is shown formed over the gate oxide and in a direction which may be, for example, normal to the direction of the fin 203, so that the gate intersects the fin and overlies the fin in the channel region and the gate oxide. After the gate electrode is formed, conventional processing steps such as ion implantation may be used to dope the source and drain regions, also protective sidewalls may be formed to narrow and protect the fin, and other additional conventional processing steps may be used, which are not shown.

The device of FIG. 7 has many advantages over planar transistor devices, such as those formed in FIG. 1. The multiple gate structure greatly reduces or eliminates many problems of the prior art devices due to the reduction in scale, including the short channel effects and improves the drain induced barrier layer (DIBL) problems over the planar devices of the prior art. These effects are becoming more significant with reduced device scaling of current semiconductor processes and so the advantages of the finFET transistor likewise become more important.

A need thus exists for a single semiconductor manufacturing process which can be used to fabricate, on a single integrated circuit, the various elements of conventional planar logic MOS transistors or circuitry, MIM capacitors, and finFET transistor devices, for use in manufacturing fully integrated and highly functional integrated circuits using any or all of these elements. This need is addressed by the various methods and structures of the present invention.

SUMMARY OF THE INVENTION

Various embodiments of the present invention provide a novel process for fabricating a planar logic circuit structure, a MIM capacitor structure and a finFET transistor structure, on a single integrated circuit or semiconductor device, in which the finFET transistor is formed in a polysilicon layer and the MIM capacitor is formed in insulating layers above the substrate of the semiconductor device. The finFET transistor and the MIM capacitor may form a 1T-RAM bit cell; although other circuit arrangements are also contemplated for these elements.

In accordance with a preferred embodiment of the present invention, a semiconductor device includes a substrate in which one or more planar transistor devices are formed, a first insulating layer formed over the substrate, at least one second insulating layer formed over the first insulating layer, at least one MIM capacitor formed in the first insulating layer and the at least one second insulating layer, and at least one finFET transistor formed in the device. The at least one MIM capacitor includes a first conductive layer, a dielectric layer disposed over the first conductive layer, and a second conductive layer formed over the dielectric layer. The first conductive layer extends completely to a top surface of the at least one second insulating layer. The finFET device is formed in the first polysilicon layer or may be formed in other insulating layers above the substrate.

In accordance with another preferred embodiment of the present invention, a semiconductor device includes a substrate including at least one planar transistor, shallow trench isolation layers defining silicon fins in the substrate, a gate dielectric and a gate polysilicon layer forming the gates of at least a first planar transistor and at least a finFET transistor over the substrate, a first insulating layer formed over the substrate, a second insulating layer formed over the first insulating layer, at least one MIM capacitor is formed in the at least one second insulating layer and coupled to the finFET by means of a via through the first insulating layer. The at least one MIM capacitor includes a first conductive layer, a dielectric layer disposed over the first conductive layer, and a second conductive layer formed over the dielectric layer.

In a preferred method of the invention, at least one planar transistor, at least one finFET transistor and at least one capacitor are formed over a substrate as follows. The substrate is etched to produce shallow trench isolation regions. A coating is formed over the planar transistor region leaving the other regions exposed. In the exposed regions, an etch is performed in certain ones of the shallow trench isolation regions to remove a portion of the shallow trench isolation oxides and provide silicon fins with exposed sides in the substrate. The protective coating is removed and processing continues by depositing a gate dielectric over the silicon fins and over the planar logic region, and a gate conductor is deposited over the substrate. The gate conductor and the gate dielectric underlying it is then patterned to provide gate conductors overlying gate dielectrics in the planar transistor region and a gate conductor overlying a gate dielectric in the finFET region. Doping is used to create source and drain doped region self-aligned to the gate conductors in the planar region and also in the finFET region, preferably coatings are deposited using conventional photomasks to allow different doping steps for the planar region and the finFET regions. After the planar and finFET transistors are completed, at least a first and a second insulator regions are deposited over the substrate, and at least a MIM capacitor is formed in the second insulating region. In a variation, a third insulator layer is formed over the second insulator layer, and a conductors are formed and patterned on the third insulator layers. Contacts and vias are formed in each insulator layer to couple the source, drain and gate conductors and at least one plate of the capacitor to certain of the conductors formed on the third insulator layers to allow circuits to be defined using the planar transistor, the finFET transistor and the MIM capacitor.

In yet another embodiment, a method is provided to form an embedded RAM cell for integration with a planar transistor in a single semiconductor device. In a semiconductor substrate or alternatively in a region of semiconductor material deposited over an insulator, shallow trench isolation regions are formed and filled with an oxide. A planar transistor region and a memory region are defined. A coating, which protects the planar transistor region is formed over the planar transistor region using a first photomask. Certain shallow trench isolation regions are partially etched to form silicon fins with partially exposed sidewalls in the memory region. The protective coating is removed from the planar transistor region and gate dielectric material is deposited over the substrate in both regions. Gate conductive material is deposited over the gate dielectric material. The gate conductive material and the gate dielectric material is patterned to form a gate in the planar transistor region and to form a gate over the finFET transistor in the memory region. The first photomask is again used to form a coating over the planar transistor region, and source and drain regions are created for the finFET transistor in the memory region by performing implants of dopant material adjacent the gate conductors. A similar protective coating is then provided over the memory region and source and drain regions are formed for the planar transistor by performing implants of dopants into the substrate adjacent the gate conductors in the planar transistor region. After the transistors in both the planar region and the memory region are completed, a first insulator layer is deposited over the substrate. Contact regions to selected ones of the source and drain regions, and to the gate conductors, are formed by etching the first insulator. Depositing conductive material in the vias forms conductive vias. A second insulator layer is deposited over the substrate. A capacitor is formed in the memory region by patterning and etching an opening in the second insulator layer and depositing a first conductive plate material, one or more dielectric or insulator materials, and a second conductive plate material. Other contacts are patterned and etched in the second insulator material and conductive vias are provided to electrically contact the conductive vias in the first insulator material. A third insulator material is provided, it is also patterned and etched to form contacts to the vias in the second insulator material and to the second plate of the conductor, conductive vias are formed and conductors are formed by depositing, patterning and etching a conductive material over the third insulating layer. In the method just described, the finFET transistor is coupled at either its source or drain terminal to one plate of the capacitor, and together the finFET and the capacitor provide a 1T-RAM bit cell. In another preferred embodiment, the 1T-RAM bit cell may be part of a macro cell which optionally includes additional 1T-RAM bit cells to form logical circuits such as a memory array, register, FIFO, register file, or other storage element, the macro cell may also include planar transistors fabricated in standard CMOS logic technology, e.g., without the finFET transistors for peripheral circuitry such as buffers, clock fan out circuits, inverters, logic gates and the like.

In another embodiment, an embedded RAM cell is provided in a semiconductor device with planar transistors. The RAM bit cell is a 1T-RAM bit cell including a finFET transistor coupled to a word line and a bit line and coupled to one plate of a MIM capacitor, in order to allow charge to be placed into and removed from the capacitor; the transistor and the capacitor forming the RAM storage bit cell. The planar transistors may be coupled to the finFET and may provide additional functionality associated with the RAM bit cell, alternatively the planar transistors may not be coupled to the RAM bit cell and may provide functionality that operates independently of the RAM bit cell.

In another preferred embodiment, an embedded memory array is provided in a semiconductor device having planar logic transistor circuitry; the memory array comprises a plurality of finFET transistors formed in a substrate and a plurality of MIM storage capacitors formed adjacent to and electrically coupled to respective ones of the finFET transistors, so that an array of 1T-RAM bit cells each having an access transistor which is one of the finFETs and a storage capacitor which is one of the MIM capacitors is provided. Preferably, word lines are coupled to the gate conductors of the finFET transistors, bit lines are coupled to a source or drain terminal of the finFET transistors, and one plate of the capacitors is coupled to the remaining source or drain terminal of the finFET transistors, the capacitors and finFET transistors operating responsive to the word and bit lines to form a memory array in the integrated circuit.

In another preferred embodiment of the invention, the MIM capacitor is formed using a technique to create a roughened, granular bottom electrode over a layer of irradiated metal, the dielectric and the top electrode material are conformally deposited using atomic layer deposition (ALD) techniques and the roughened surfaces between the plates and the dielectric result in increased capacitance in the same area.

Advantages of embodiments of the present invention include, providing a method of forming MIM capacitors in a process that is also compatible with forming finFET transistors and also P and N-type MOS transistors. These elements may be used to form an efficient memory array using finFET transistors for the cell access transistors, while simultaneously forming conventional planar MOS transistors for the peripheral circuitry, for example.

The foregoing description has outlined rather broadly the features and technical advantages of embodiments of the present invention in order that the detailed description of the invention that follows may be better understood. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 19 depicts a close up cross-section view of the MIM capacitors used in the present invention.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The operation and fabrication of the presently preferred embodiments are discussed in detail below. However, the embodiments and examples described are not the only applications or uses contemplated for the invention. The specific embodiments discussed are merely illustrative of specific ways to make and use the invention, and do not limit the scope of the invention. The figures are for illustrative purposes and are not drawn to scale.

The present invention will be described with respect to preferred embodiments, some of which are described in terms of an example application for an embedded DRAM device incorporating a finFET access transistor in the memory array area. The embedded DRAM may be incorporated into any number of integrated circuits including microprocessors, digital and analog signal processors, microcontrollers, ASICs of any kind, and other integrated circuits which use storage as part of the circuitry, particularly, integrated circuits which process data. Embodiments of the present invention may also be applied, however, to other semiconductor applications that utilize MIM capacitors, for example, an integrated memory device (SDRAM, DRAM, DDR SDRAM, RDRAM, and the like) may be fabricated using the MIM capacitor and the finFET transistors of the invention, other applications where capacitors are used as circuit elements which may benefit from the use of the invention, include switched capacitor circuits, filters, analog to digital converters, digital to analog converters, RF circuits, signal processors, digital signal processors, neural networks and the like.

Figure 1:
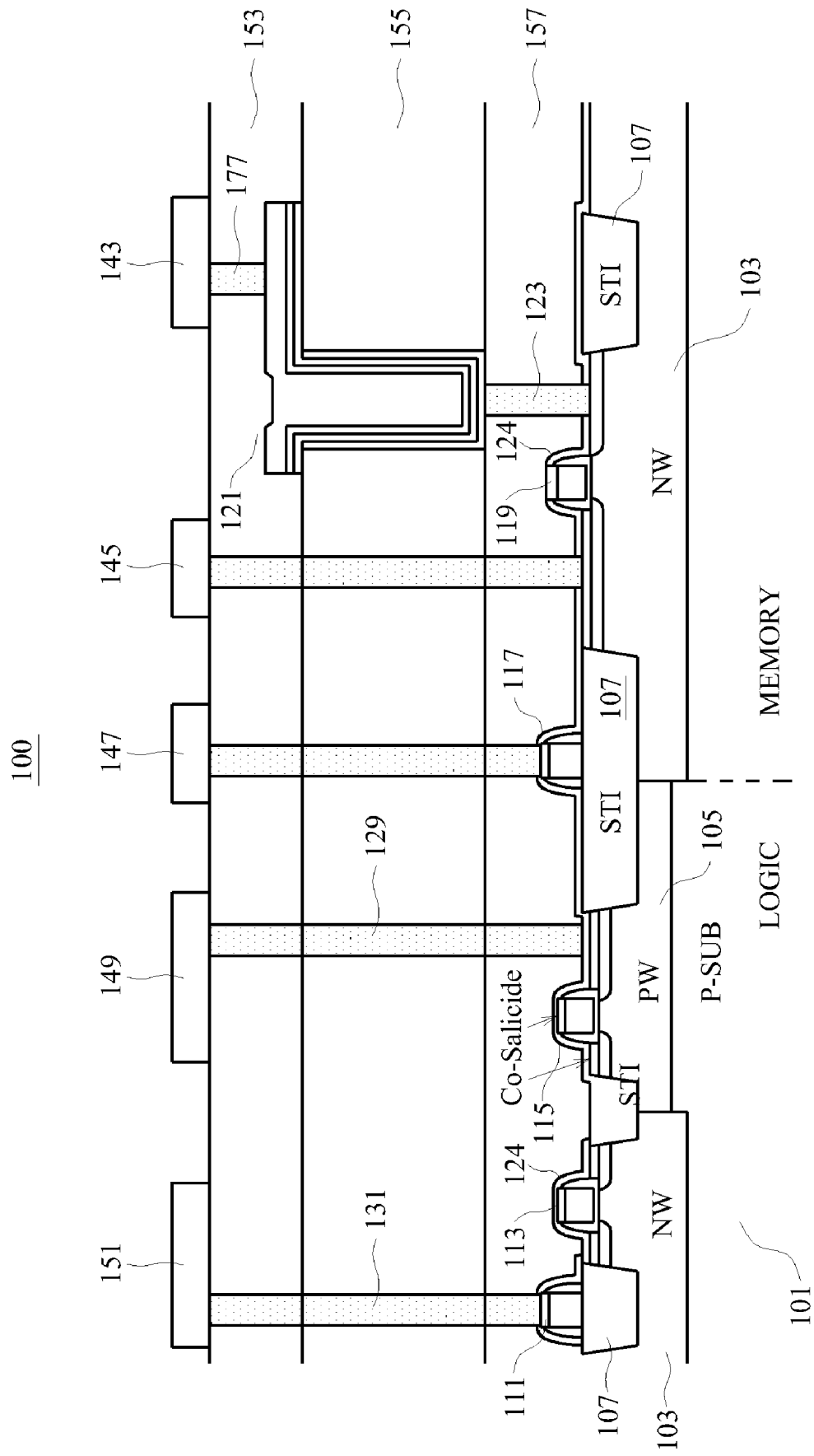
FIG. 1 depicts in a cross-sectional view a prior art semiconductor device including planar transistors, an access transistor, and a MIM capacitor formed in a single device structure.
Figure 2:
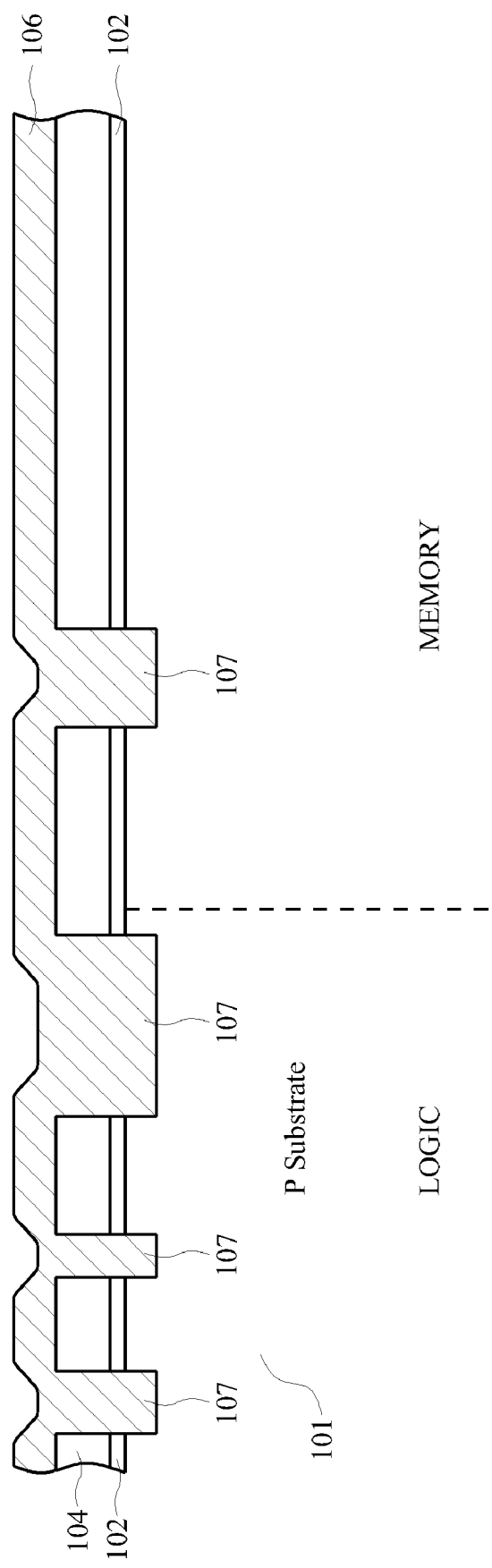
FIG. 2 depicts a first partial processing step to make the structure of the cross section of FIG. 1.
Figure 3:
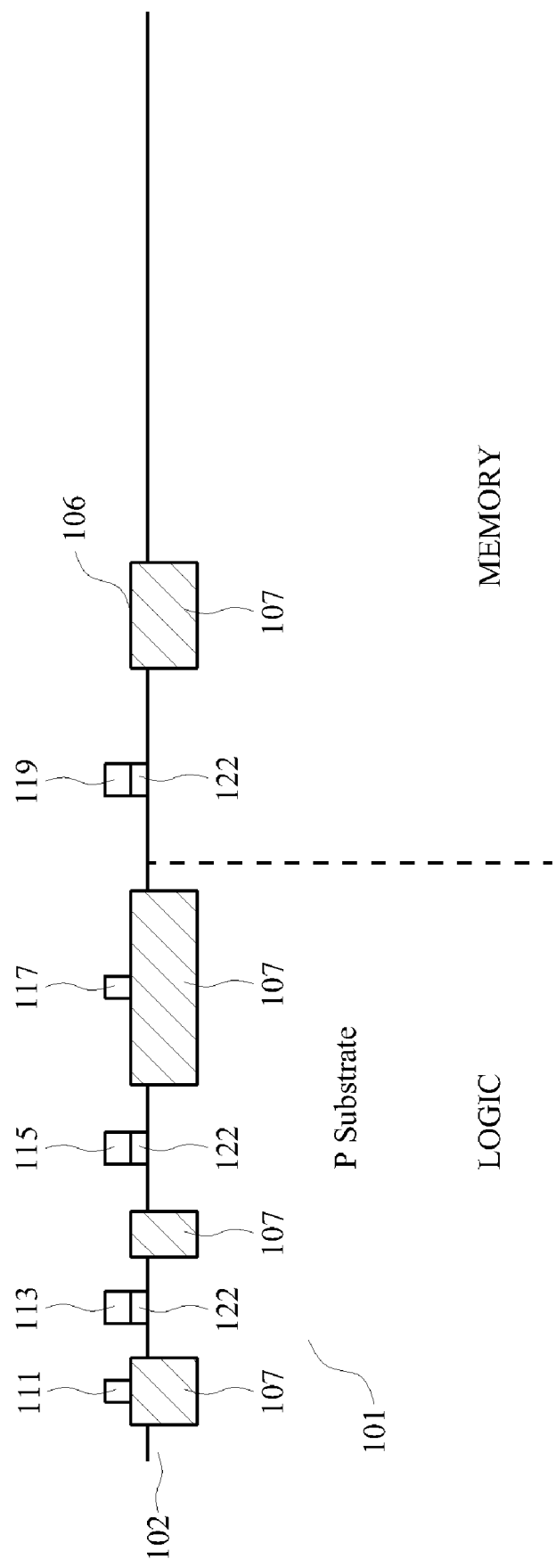
FIG. 3 depicts a cross-section of the structure of FIG. 2 following additional processing steps.
Figure 4:
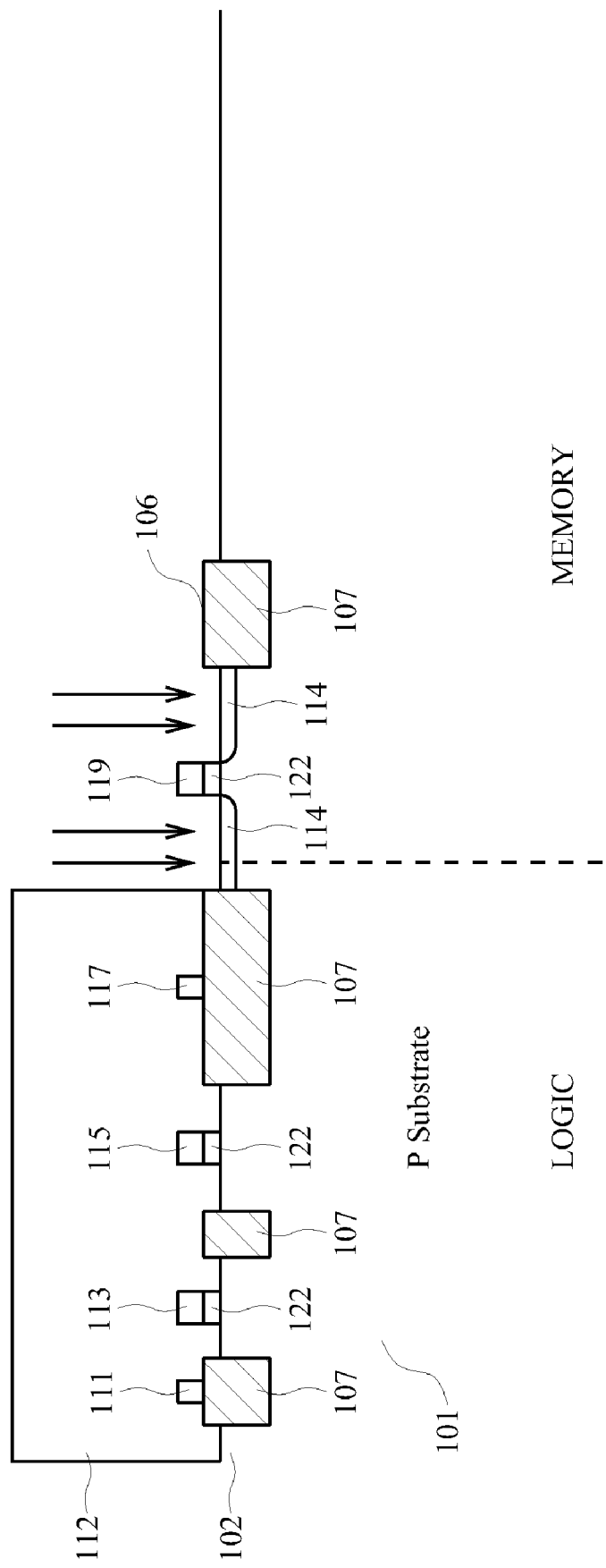
FIG. 4 depicts an ion implantation step applied to the structure of FIG. 3.
Figure 5:
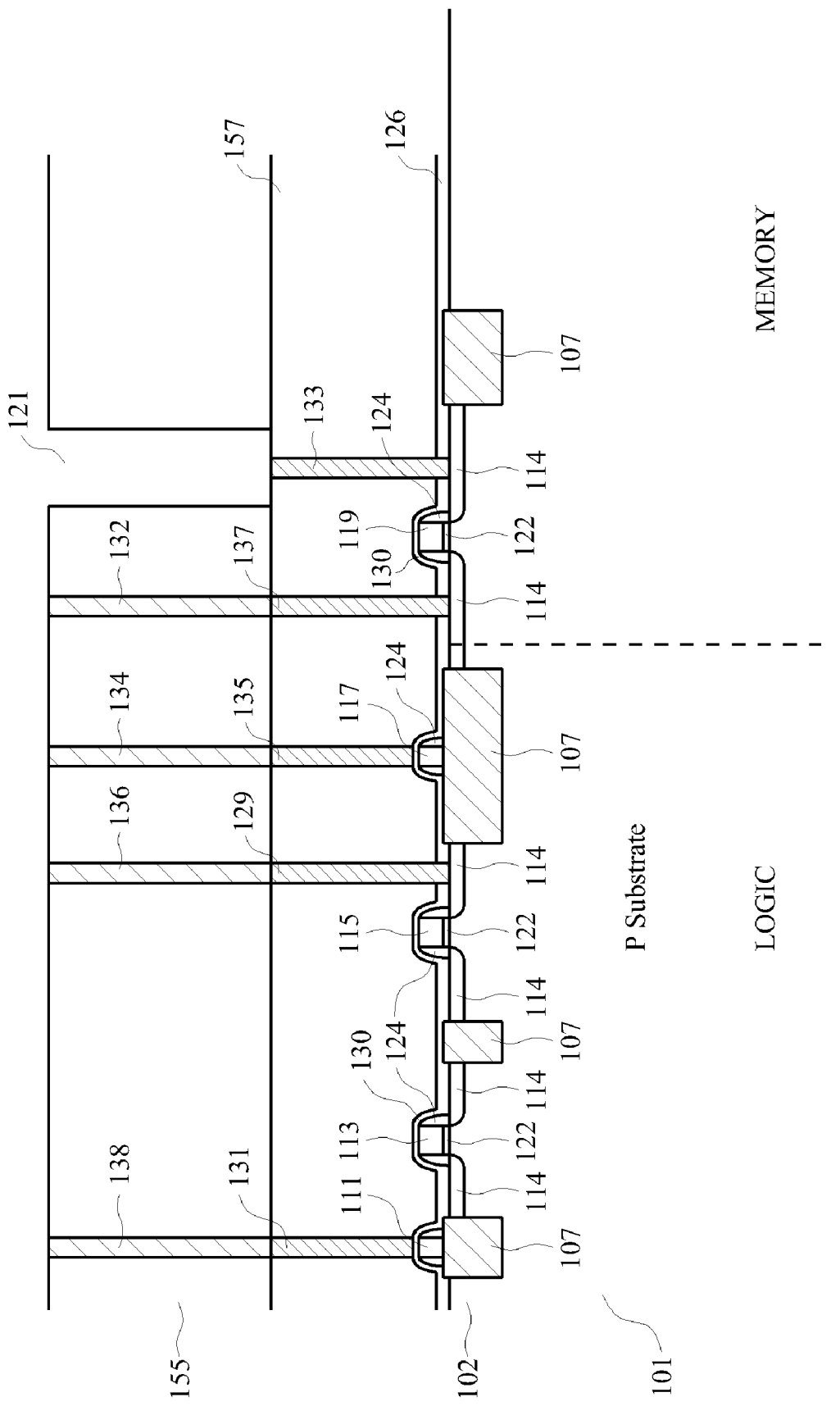
FIG. 5 depicts the cross-section of the device of FIG. 4 following additional processing steps.
Figure 6:
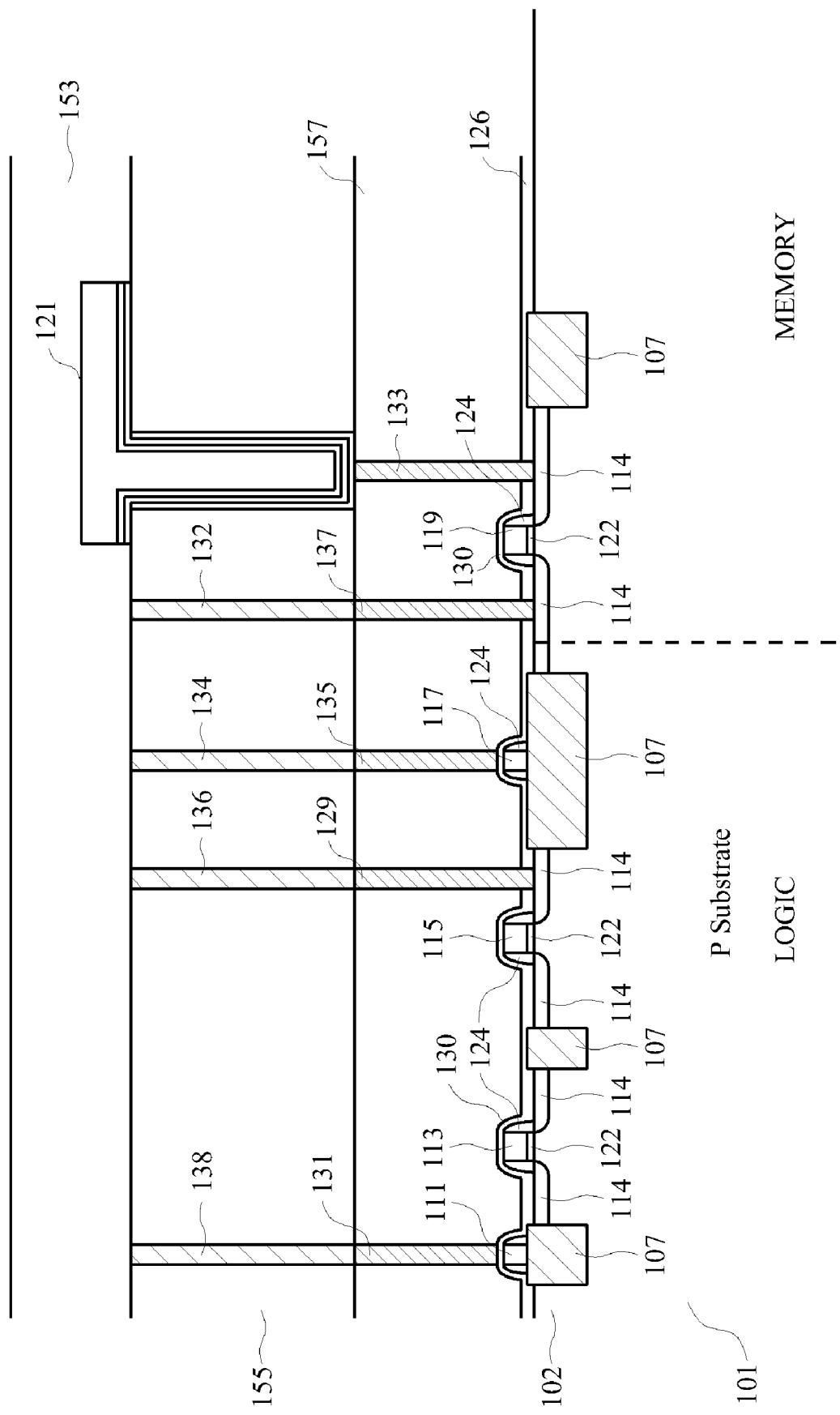
FIG. 6 depicts the cross-section of the device of FIG. 5 following additional processing steps.
Figure 7:
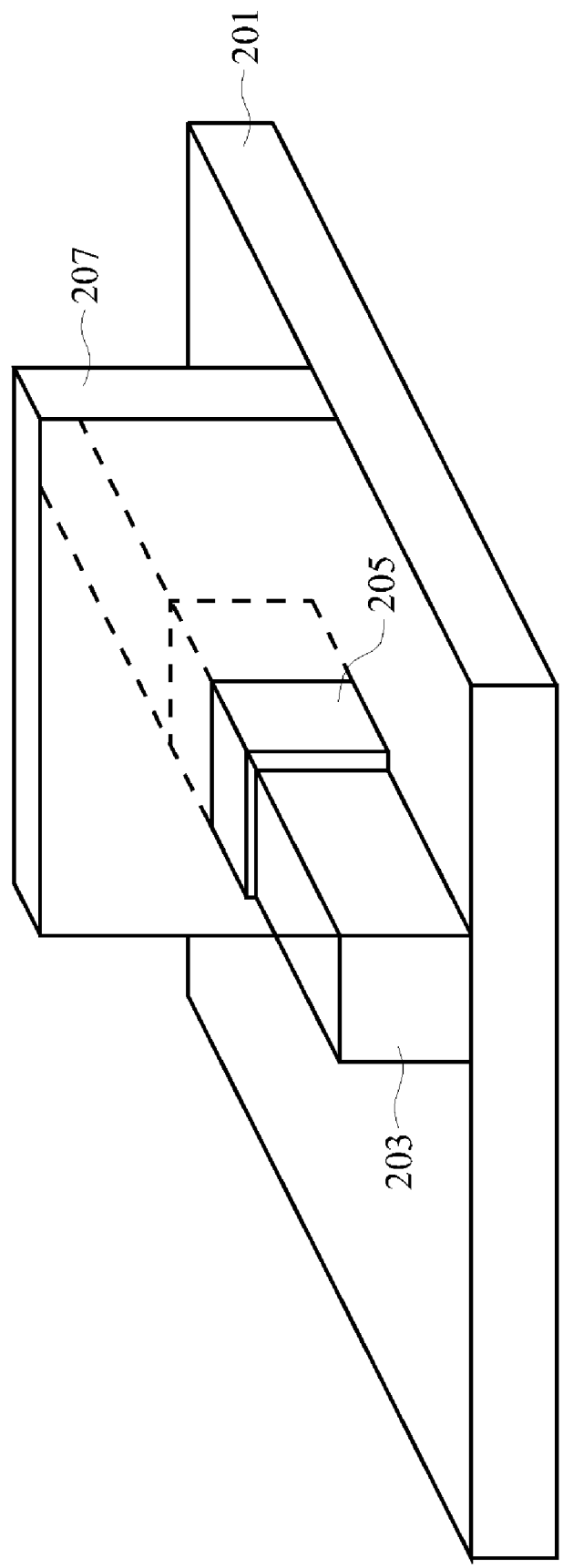
FIG. 7 depicts a three dimensional view of a finFET device of the prior art.
Figure 8:
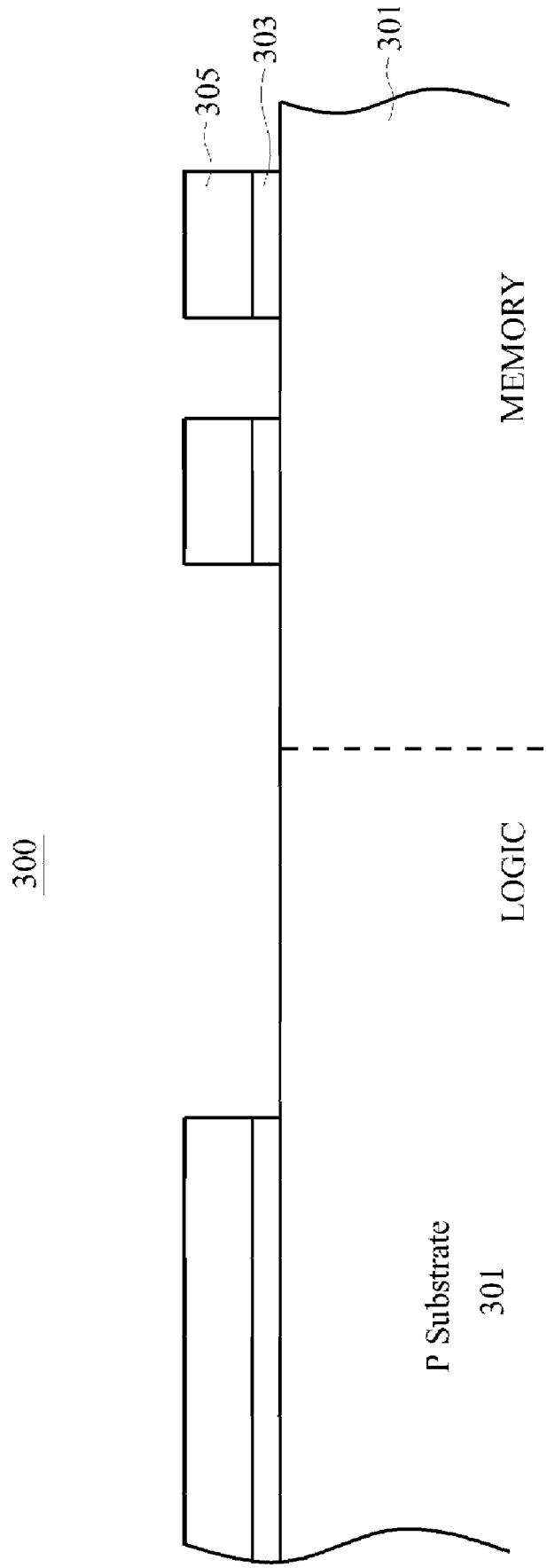
FIG. 8 depicts a cross-section of a preferred embodiment of the invention following partial processing.

FIG. 8 depicts in cross-section a substrate 301, which has been divided into logic and memory regions. Pad oxide 303, nitride 305 and a pattern photomask 306 have been deposited over the substrate and the mask 306 has been patterned to define shallow trench isolation regions to be etched.

Figure 9:
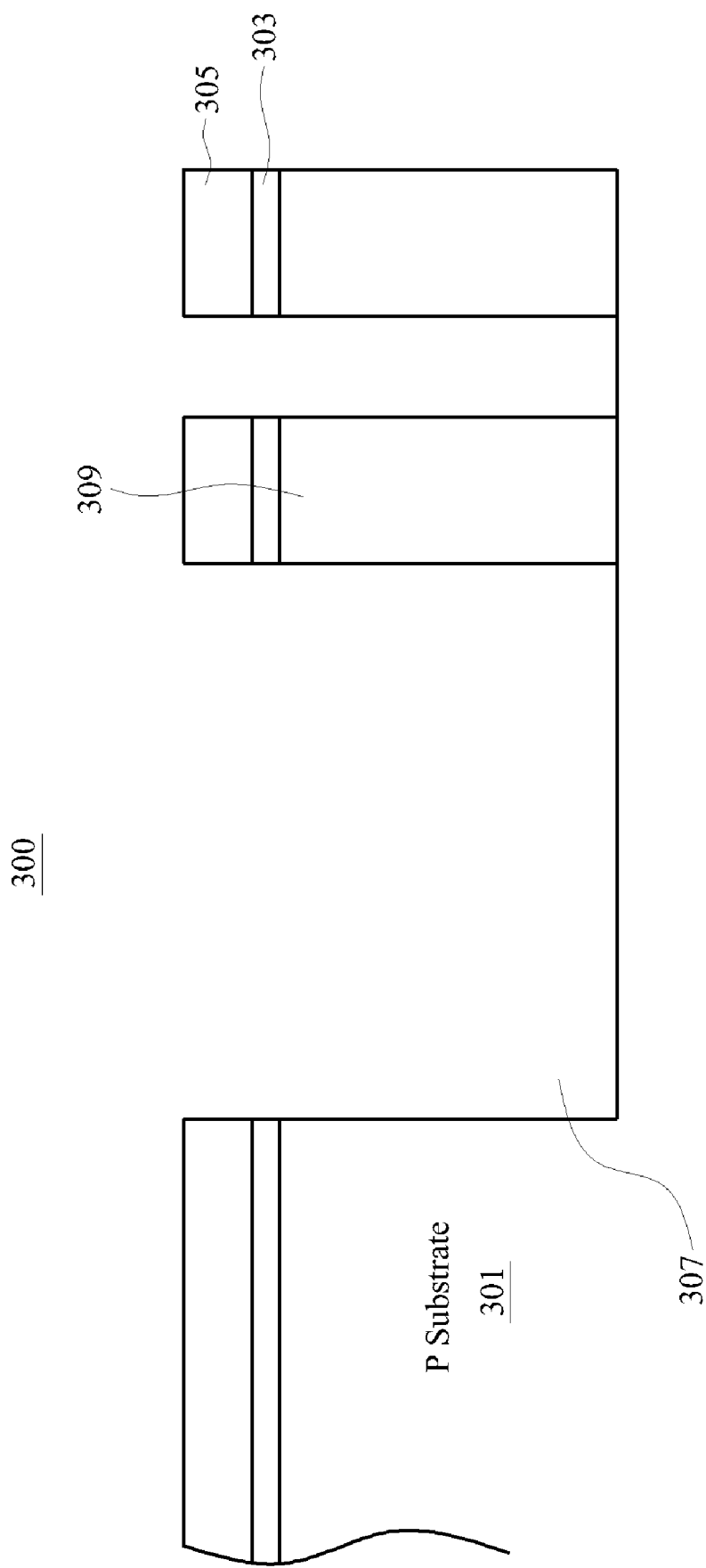
FIG. 9 depicts the cross-section of FIG. 8 following an etching step.

FIG. 9 depicts the cross-section of FIG. 8 showing substrate 301 following the shallow trench isolation etch step, which may be performed, for example, in a plasma etch process using a wet etch such as HF chemistry or alternatively a dry etch may be performed. The figure shows the trenches 307 which may be quite deep, for example, 500-5000 Angstroms, in a preferred embodiment the depth may be 2000 Angstroms. Mask 306, nitride 305 and oxide 303 may be removed after the etch is completed using conventional techniques or removed in a subsequent CMP step. The "fins" 309 are now defined as columns of the substrate material, the top portions of these fins will form the source and drain and channel regions of the finFET devices.

Figure 10:
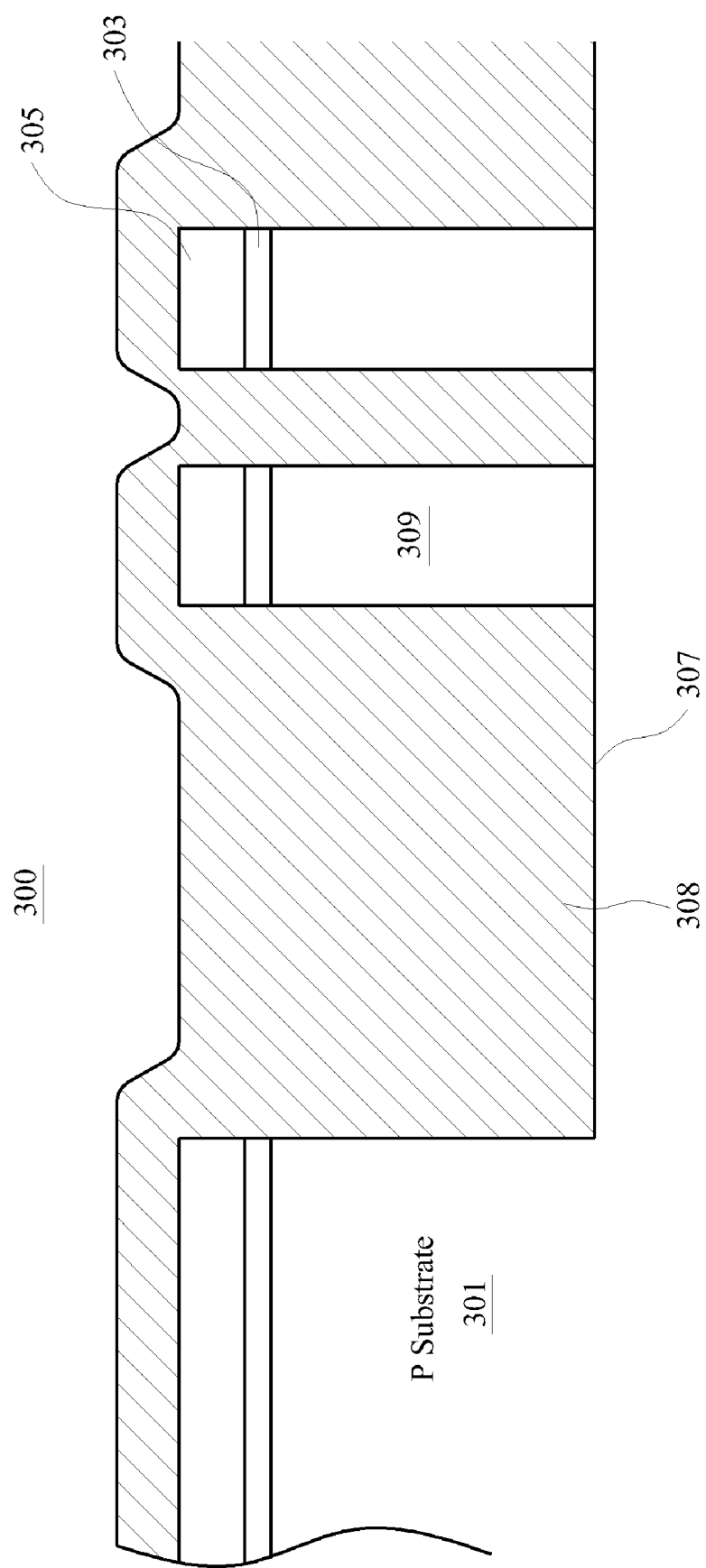
FIG. 10 depicts the cross-section of FIG. 9 following the formation of trench isolation material.

FIG. 10 depicts the cross-section of substrate 300 following the trench oxide formation step. Oxide 308 is deposited over the substrate and fills the shallow trench isolation regions, as described above, and extends over the substrate, generally conformally as shown. The trench oxide may be a high density plasma (HDP) oxide formed as described above.

Figure 11:
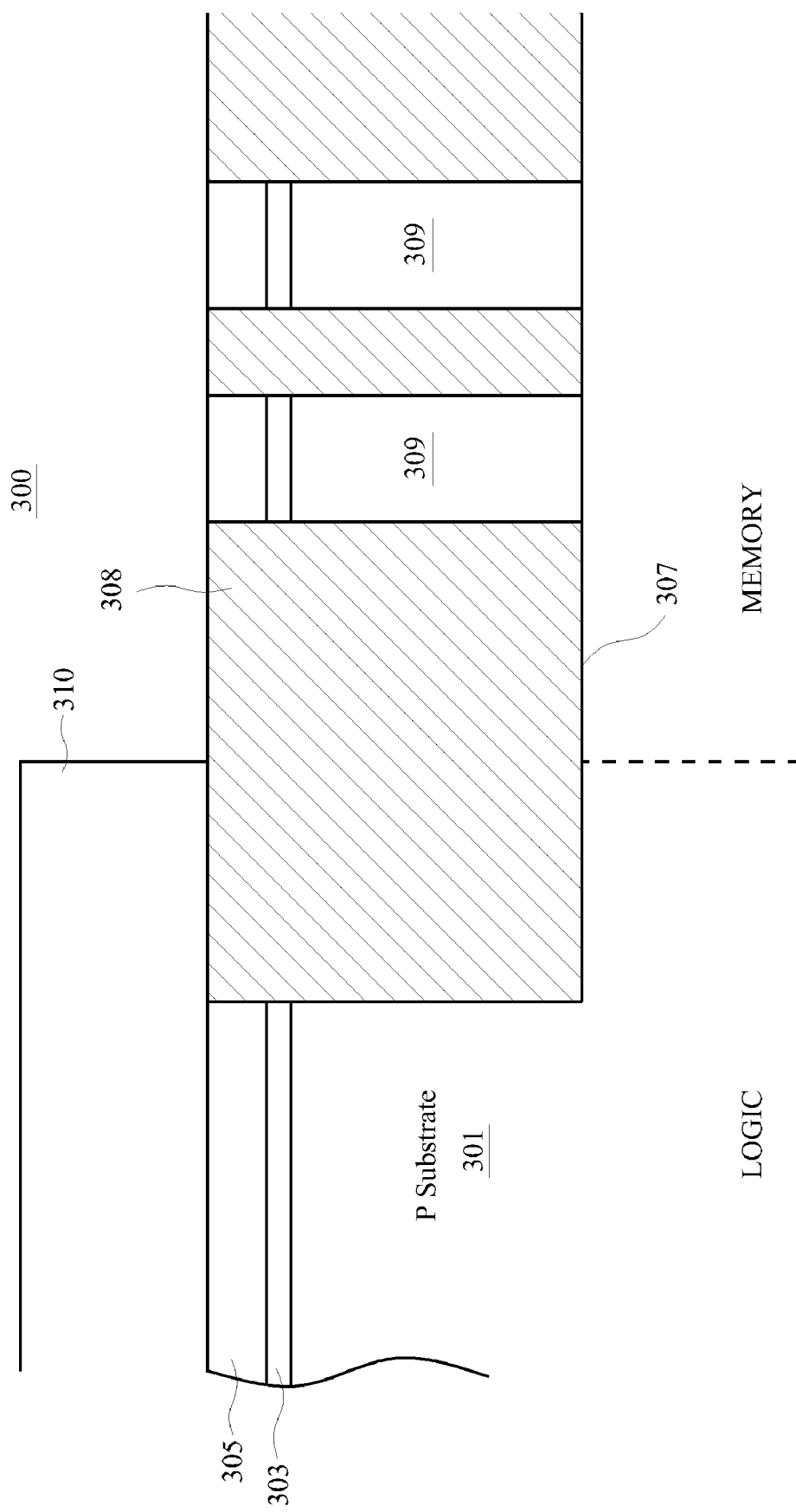
FIG. 11 depicts the cross-section of FIG. 10 following the formation of a protective coating over a portion of the substrate.

FIG. 11 depicts the cross-section of FIG. 10 following the chemical mechanical polishing step (CMP) to complete the trench oxide 308 by planarization, and the formation of a photomask coating 310 over the logic area of the device 300. The photomask coating 310 is comprised of a conventional photoresist which is deposited, exposed and patterned to leave the memory area exposed for processing, while protecting the logic area. The photomask coating 310 may be hardened by thermal or other processes as is known in the art. Importantly, while this mask step is an extra step required to form the finFET transistors over the prior art MOS processes without the finFET devices, the same CLDD mask may be used as is subsequently used in a later step for forming the lightly doped drain and source regions in the memory area, so no additional photomask fabrication is required, only an additional photoresist coating and exposure step, thus the new devices may be fabricated using an existing mask set from the prior art approach, which is an advantage of the present invention. The use of photoresist coatings to allow various regions in a substrate to be processed in an asymmetric fashion is described in U.S. Pat. No. 6,620,679, to Tzeng et al, which is hereby incorporated by reference, at column 3 lines 30-67 and continuing onto column 4 lines 1-55; in the patent an I/O area and a core device area receive different ion implants to produce differing dopant concentrations where needed. Similarly in the process of this invention, certain process steps are performed in the memory region which differ from those steps performed in the logic region of substrate 301, and so this inventive process is also asymmetric.

Figure 12:
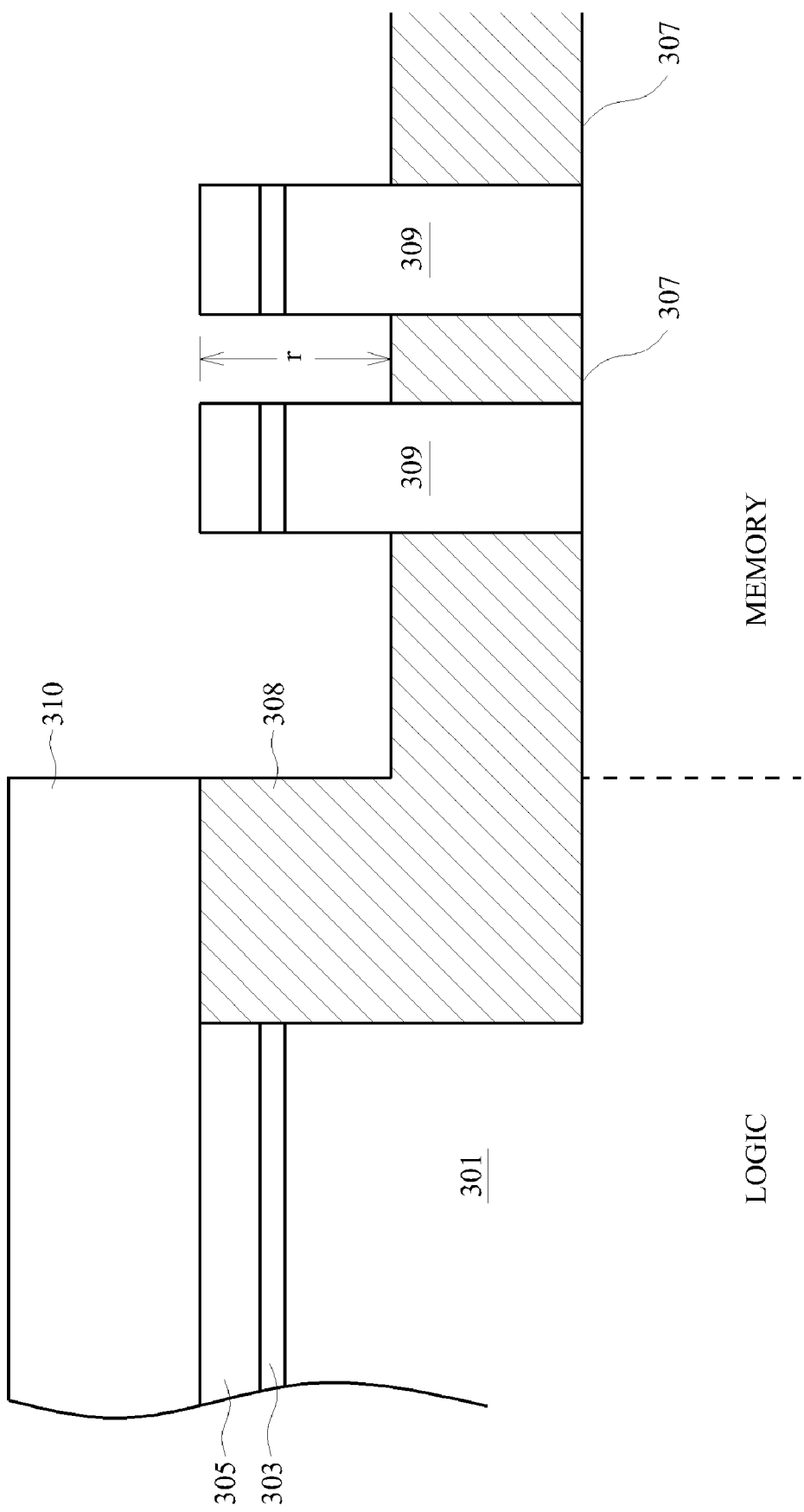
FIG. 12 depicts the cross-section of FIG. 11 following the etch of the unprotected area of the substrate of FIG. 11.

FIG. 12 depicts the cross-section of FIG. 11 following an additional etch step. Oxide etching is again performed in the shallow trench isolations 307 of the memory region, now to pattern the oxide 308 in the shallow trench isolation regions 307, this etch removes a portion of the STI oxide to expose a portion of the upper part of columns 309 for the finFET transistors. The upper portion of columns 309, which are part of the semiconductor substrate 301, are exposed to a depth "r" sufficient to allow the fabrication of multiple gate finFET devices over these silicon fins. The depth "r" maybe from 100-1000 Angstroms, as desired.

Figure 13:
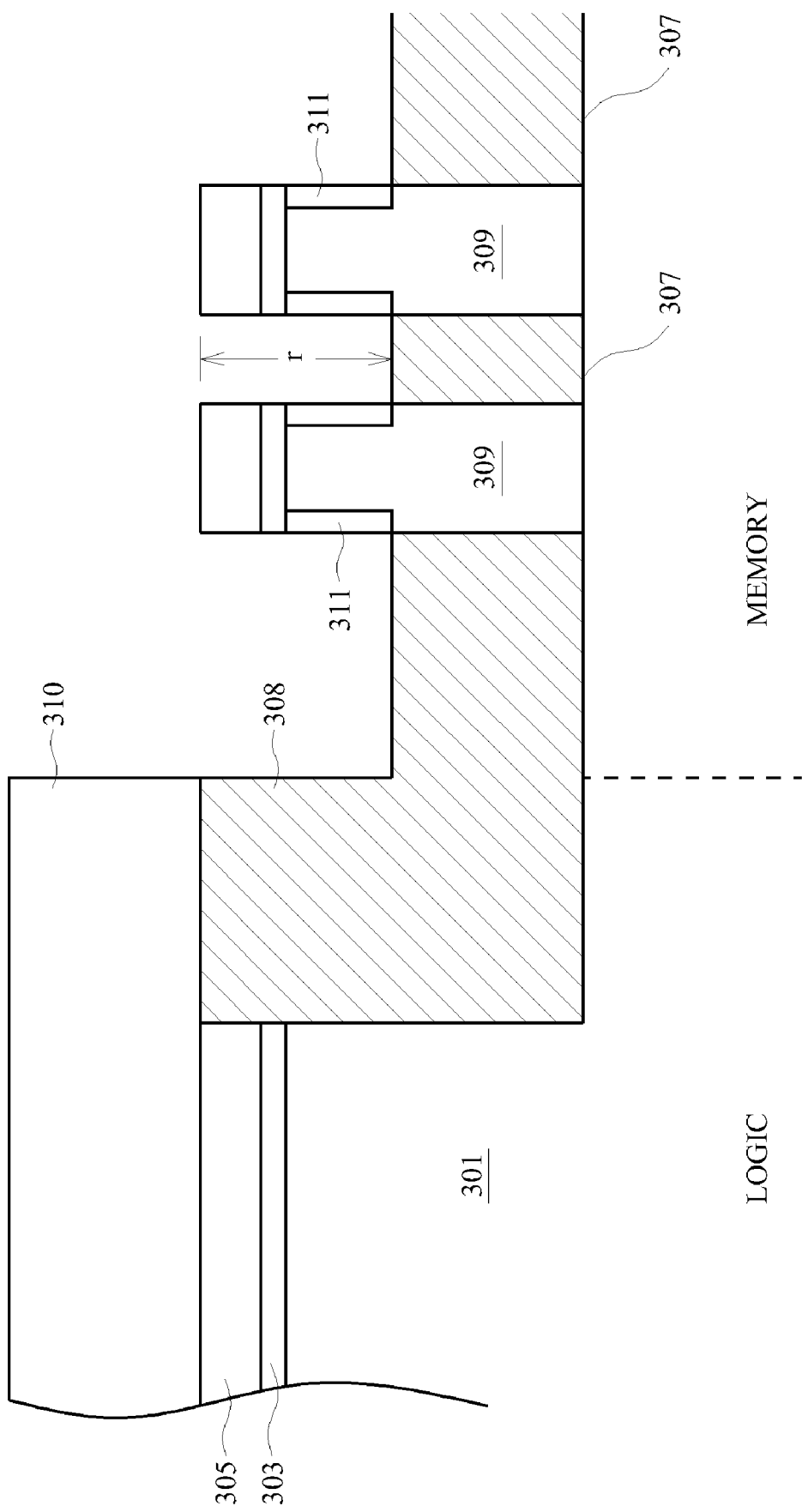
FIG. 13 depicts the cross-section of FIG. 12 following the formation of sidewall oxides on the etched fins.

FIG. 13 depicts the cross-sectional view of FIG. 12 following another process step applied to the device 300. Following the patterning etch of FIG. 12, which exposes the sidewalls of the columns 309, a pad oxide is formed on these sidewalls by thermal oxidation, to form a silicon dioxide or a silicon oxynitride 311. Conventional process steps, such as rapid thermal oxidation (RTO), can be used to form this sidewall oxide, which preferably consumes some of the silicon at the sidewalls, and so thins the fins for the finFET devices to be formed subsequently of the columns 309, also, the oxide has the effect of repairing damage to the sidewalls that occurs normally during the etch step that formed the sidewalls, and protects the surface of the sidewalls during a subsequent nitride removal step.

Figure 14:
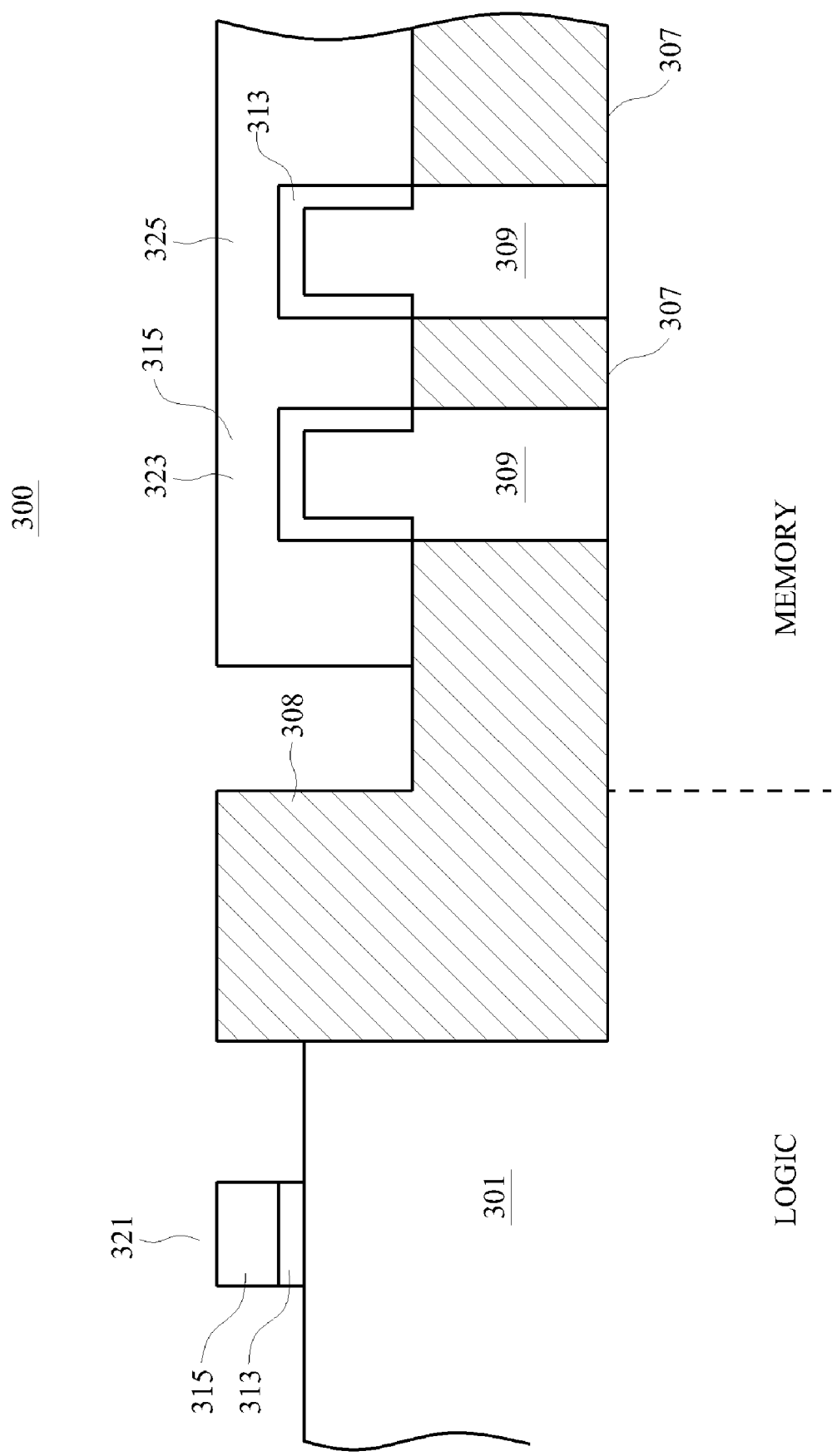
FIG. 14 depicts the cross-section of FIG. 13 following additional processing steps of the invention.

FIG. 14 depicts the cross-section of FIG. 13 and shows the device 300 following the removal of the photoresist mask coating 310, the nitride 305 and the oxide 303, and the thinning sidewall oxides 311, which leave a thinner pair of fins 309. The thinner fins may be thin only in the area where the gate dielectric or oxide and the gate electrode will overly the fin, as will be described below, source and drain regions may be formed at the end points of the fin, which are larger in area for ease of contact and via formation to upper level metallization layers, to be shown in subsequent steps.

FIG. 14 further depicts the gate dielectric material 313 and the gate electrode 315 after it has been deposited, patterned and etched to form the gate electrode and insulated gate in the logic region for a planar MOS transistor 321, and a common gate electrode is formed to complete two finFET transistors 323 and 325 in the memory region. The finFET transistors in this example may be the access transistors for two memory cells on a common word line that is electrode 315 and continues to form a row line in a memory array, for example.

As will be apparent to those skilled in the art, the finFET transistors are formed from the silicon substrate material or may be formed from a doped N or P-type well material. It has been discovered that the type of transistor being formed and the orientation of the fins with respect to the wafer orientation is important and may be used to further improve performance. The drain current of the finished finFET transistor Id will flow into or out of the page in FIG. 14, from the source to the drain region, of the finFET, when a sufficient gate voltage Vg is present on the gate electrode. If the device is a P-type, the source drain fin should be oriented so that the current flow is along the 110 crystal orientation surface from source to drain. If the finFET devices are to be N-type, the current flow from source to drain should be along the 100 crystal orientation surface. This orientation can be controlled by orienting the semiconductor substrate correctly prior to beginning processing so that the direction of the silicon fins is correctly oriented for the type of semiconductor substrate material being used.

The planar MOS transistor 321 and the finFET transistors 323, 325 of FIG. 14 may also be formed in a layer of epitaxially grown or deposited silicon material over a silicon substrate or over an insulator (SOI). The use of strained silicon materials is known in the art to improve the channel layer performance of transistors using high-k dielectrics as the gate dielectric, for example. Strained SiGe may be used as the silicon substrate 301, it may be formed over a silicon substrate or over an insulator for an SOI embodiment. The strained silicon or strained SiGe may be compressively strained for a P-type transistor, as is known in the art, or in contrast it may be provided under tensile strain for N-type transistors. The strained channel is known to improve device performance mainly by enhancing carrier mobility and in this alternative preferred embodiment, a strained channel may be used with the process and structure of this invention to further improve performance. The stressed device could also result from contact etch stop layer (CESL) or STI oxide. This approach is described by Ge, et al., U.S. Ser. No. 10/366,220 and a paper entitled "Process-Strained Si (PSS) CMOS Technology Featuring 3D Strain Engineering," IEEE, 2003, pp. 3.7.1-3.7.4, which is herein incorporated by reference.

Figure 15:
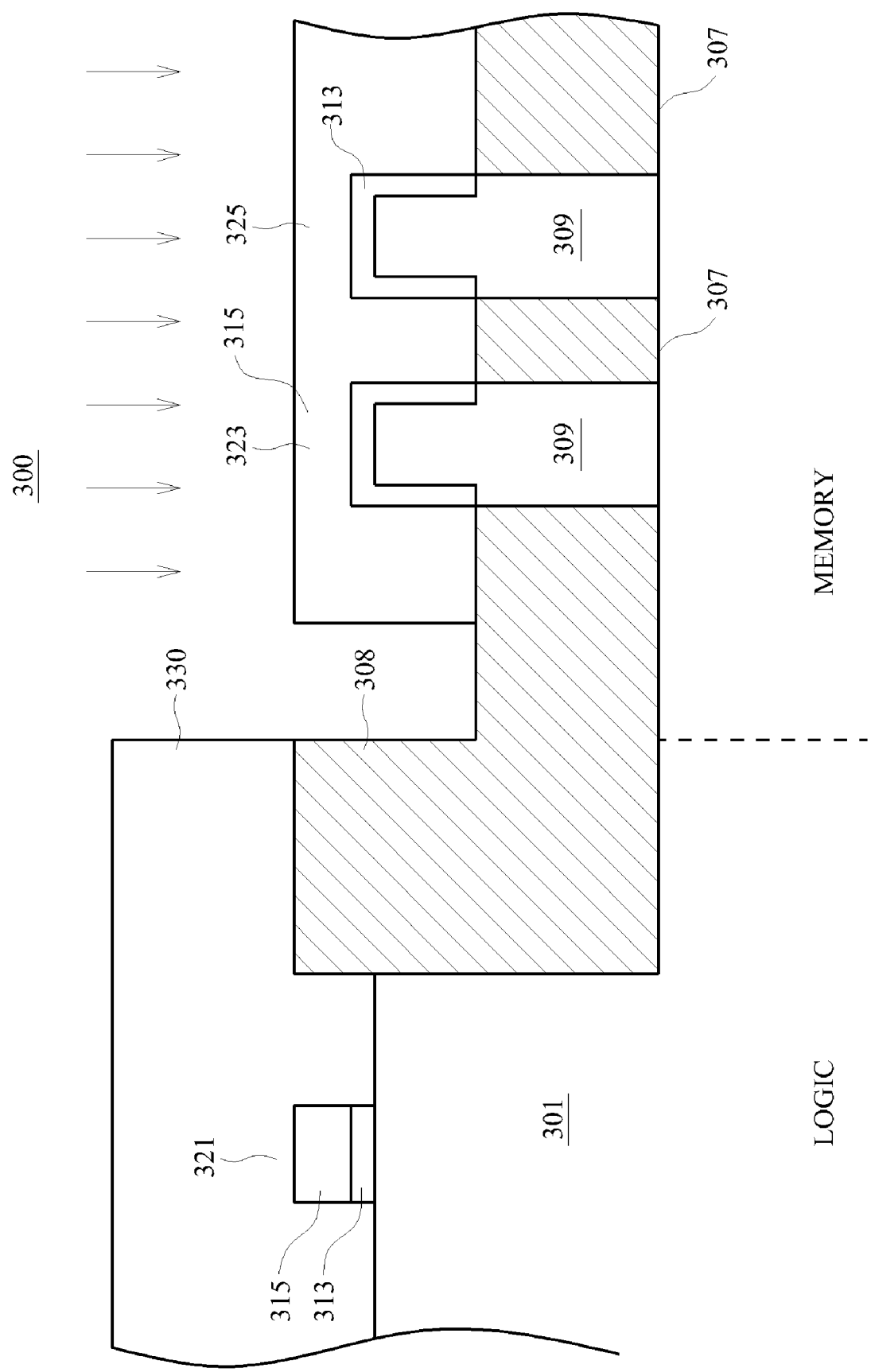
FIG. 15 depicts the cross-section of FIG. 14 following additional processing steps to form the devices of the invention.

FIG. 15 depicts the cross-section of the device 300 again using a photomask resist coating 330 over the logic area during the source drain ion implant steps for the memory area. The source drain regions for finFET transistors 323 and 325 will be formed by implanting dopants adjacent the wordline to form the source and drain for the finFET's using a photoresist coating 330 that is prepared using the same photomask as was used during the oxide etch shown in FIG. 11, above. The use of an existing photomask from the prior process in two different steps of the process of the invention makes the use of the invention economically efficient, which is an advantage.

Figure 16:
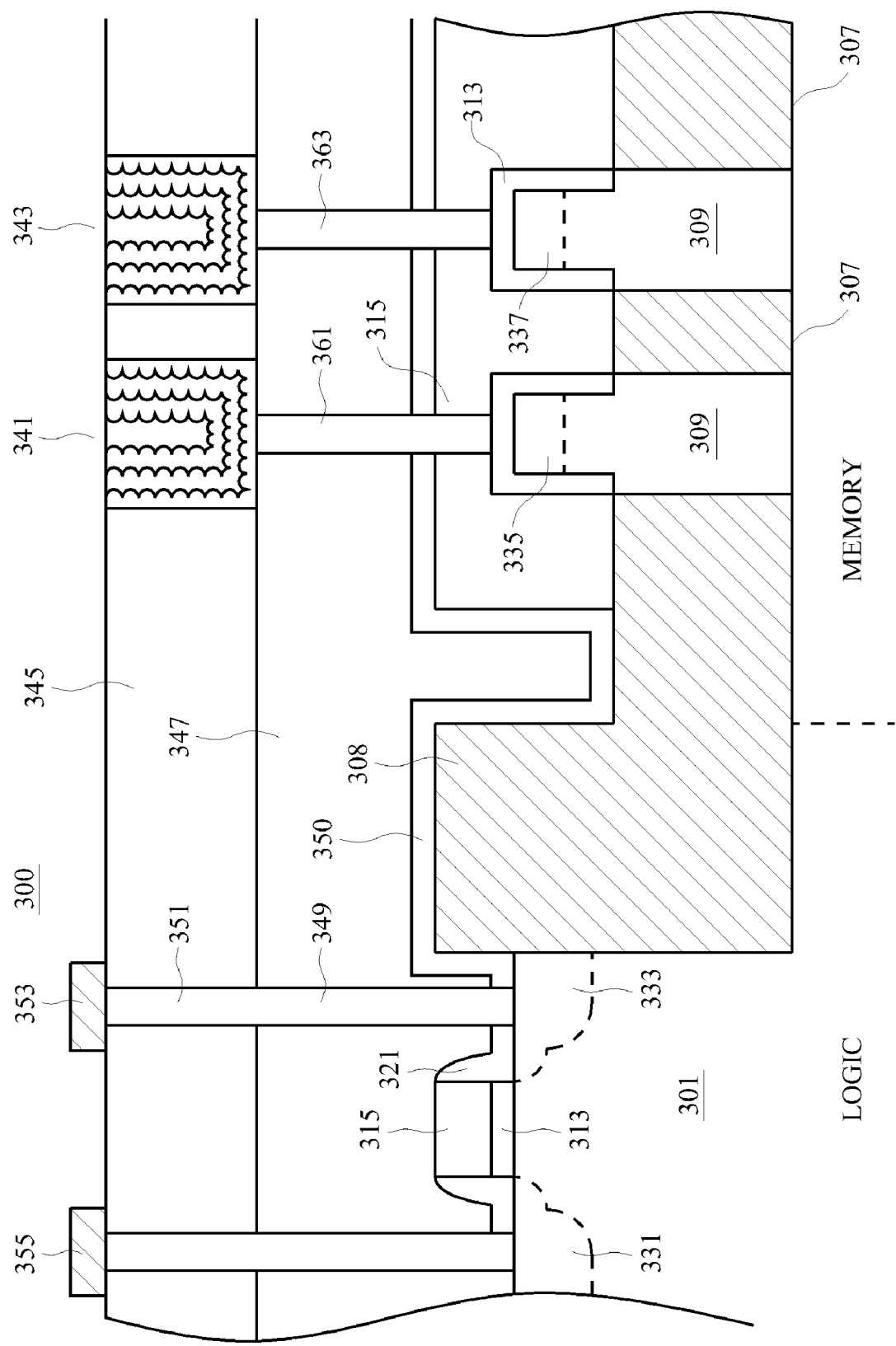
FIG. 16 depicts in cross-section a completed preferred embodiment of the invention.

FIG. 16 depicts a cross-section of the device 300 following several additional conventional steps to complete a memory device using the finFET transistors 323 and 325 and coupling those to capacitors 341 and 343. Interlevel insulator 347 and 345 are formed over the protective oxide 350, which covers the completed transistor source, drain and gate regions in both the logic and memory regions, metallization layers 353, 355 are coupled by via stacks to the source and drain regions 331, 333, contacting the regions through the protective oxide 321. Capacitors 341, 343 are formed over the finFET access transistors 315 and 313 and are coupled to the drain regions of the finFET transistors by conventional via stacks 361, 363. Bit lines (not shown) will be coupled to the source regions of the finFET transistors to complete the embedded DRAM array, and gate electrode 323 forms a common row or wordline conductor coupled to the common gate elements of the two finFET transistors.

Figure 17:
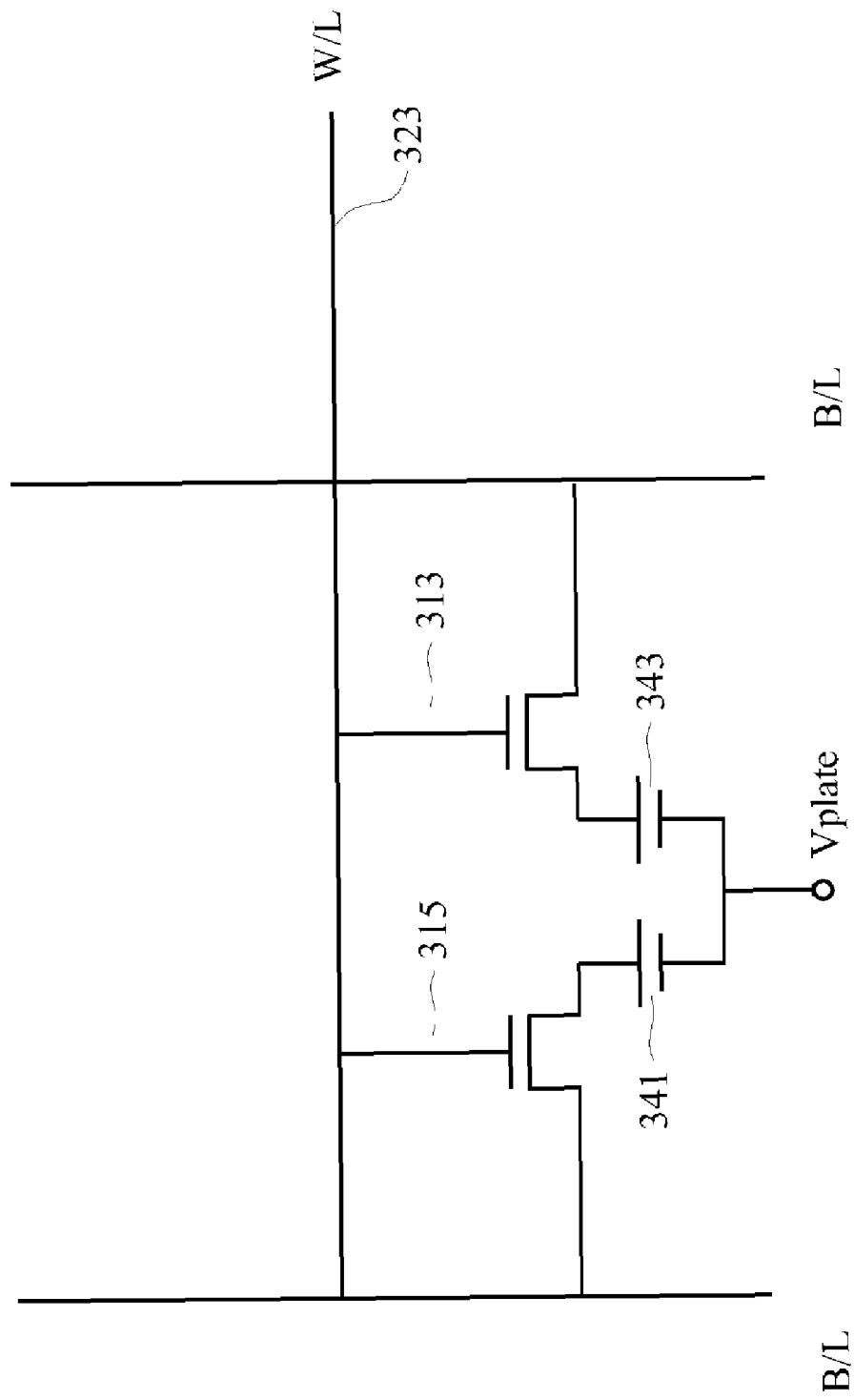
FIG. 17 depicts an exemplary circuit arrangement which can be formed using the structure of the invention.

FIG. 17 depicts the finFET transistors 315, 313 and the capacitors 341, 343 as they might be coupled in a typical application for an embedded memory storage array circuit. In the figure, bit lines B/L and B/L_ are shown as a typical bit line pair as are known in the memory art. These bit lines form columns in a memory array, which may include several thousands of cells. Wordline 323 is shown coupled to the gate terminal of transistors 315, 313. Each transistor forms the access transistor for a storage cell, which includes a MIM capacitor, 343 and 341 in the figure, each capacitor has one electrode or plate coupled to the drain terminal of the respective access transistor and the other is coupled to a fixed voltage potential, Vplate, which could be a ground or other fixed voltage. In operation, the access transistor can store or remove charge, representative of a data value, when the word line is active, putting a voltage on the gate terminal, and the potential on the corresponding bit line is applied to the first plate of the capacitor. Each access transistor 315, 313 has a bit line coupled to its source terminal.

Figure 18:
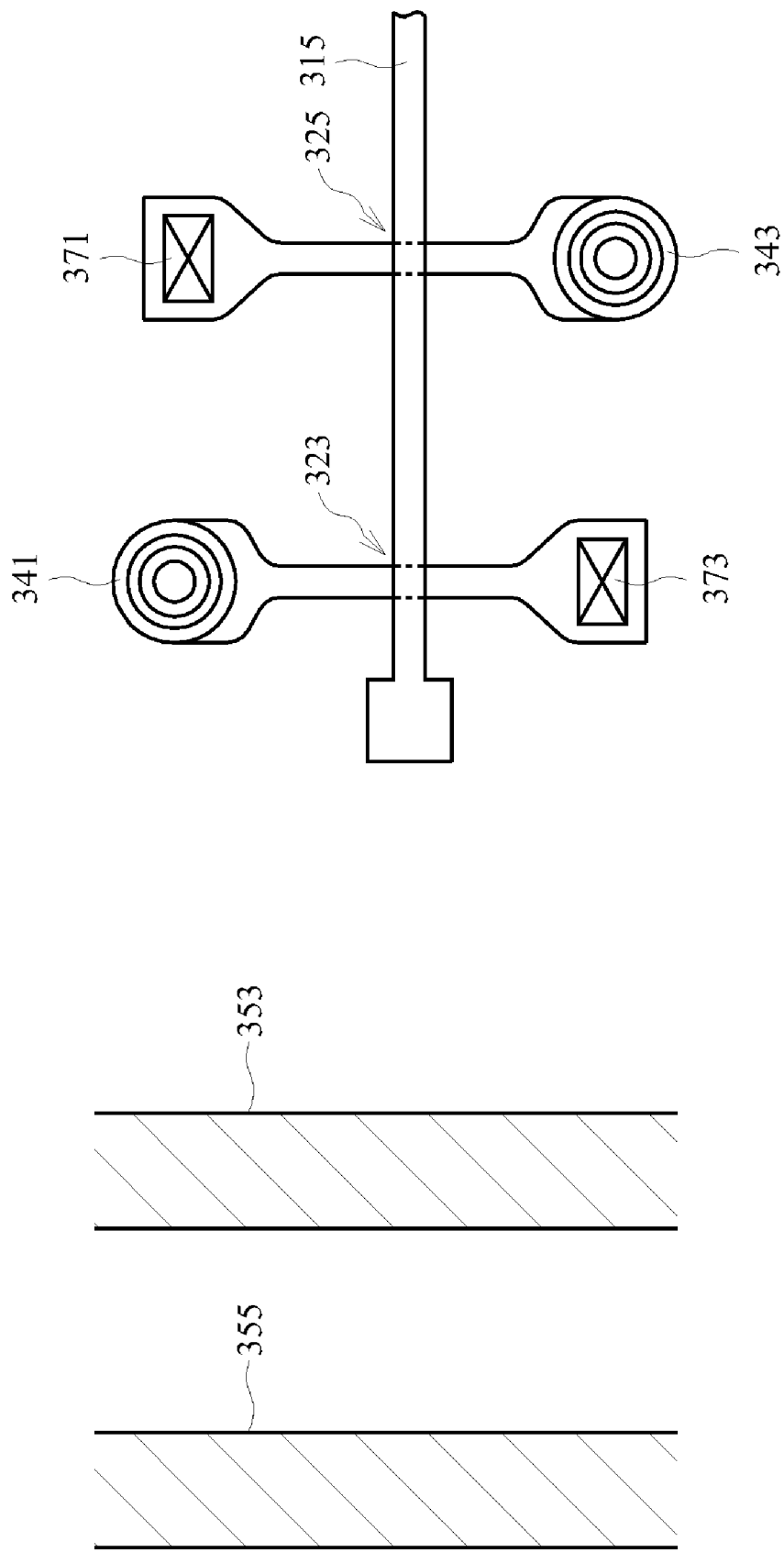
FIG. 18 depicts a top view of the devices shown in cross-section in FIG. 16.

FIG. 18 is a depiction of the memory region of the device 300, shown in cross section in FIG. 16, from an illustrative top view. Capacitors 341 and 343 are depicted in cylindrical arrangement above the drain regions of the finFET's 323 and 325. Bit line source contacts 371 and 373 are depicted and would couple the respective bit lines (not shown) to the finFET source regions by means of a vertical via stack. Wordline 323 is shown and the transistors 315 and 323 are formed at the intersection of the wordline and the respective source drain fin for each finFET. Conductors 355, 353 are shown overlying the logic device.

Capacitors 341, 343 may be MIM capacitors, which are known in the art as metal-insulator-metal capacitors formed over the storage access transistors in the interlevel insulator layers 345, 347. It is also known in the art to increase the resulting capacitance by using HSG (hemispherical grain) polysilicon as the bottom electrode and the top electrode and by using a dielectric layer which is conformal, thereby increasing the surface area of the plates and the dielectric and thus the capacitance achieved. In a paper entitled "Excimer laser manipulation and patterning of gold nanoparticles on the $SiO_2$/Si surface," by Yang et el, Journal of Applied Physics (JAPL) Vol. 95, No. 9, May 2004, herein incorporated by reference, a technique is described for obtaining granular surfaces or nanoparticles in a metal layer by treating the metal layer with an excimer laser. In a preferred embodiment of the invention, such a layer is used as a bottom layer and subsequent process steps are used to form the capacitors 341, 343 as follows.

A first layer of metal such as gold or other metal such as silver, nickel, copper, platinum, palladium, titanium and the like is deposited in the recessed areas etched into the interlevel insulator 345 for the capacitors. As is known in the art, for a vertical MIM capacitor fabricated over the access transistors, the vertical sidewall height can be varied by using thinner, or thicker, interlevel insulation as desired for a given process and target capacitance values. The bottom layer of the capacitors is coupled to the access transistors by vias through the first level of interlevel insulator 345, as is known in the art, and coupled to the drain terminals of the access transistors by typical contact openings patterned into the passivation oxide or nitride layer overlying the finFETs. The bottom layer may be formed by e-beam evaporation, for example, or other means may be used.

An excimer laser irradiation is applied to the gold bottom layer to form nanoparticles, for example, the gold may be treated with a KrF laser having a wavelength of around 248 nanometers and operating, for example, at a frequency of around 20 Hz and with a 20 nanosecond pulse (the laser itself may be, for example, a commercially available excimer pulsed laser such as a PulseMaster PM-800, available from GSI Lumonics, Inc.). Other frequencies and pulses can be used so long as nanoparticles form in the metal layer following the treatment. In other embodiments, the gold layer may be formed of similar materials, such as silver, platinum or palladium, and may be from a thickness of a few manometers to several micrometers.

Alternatively, pyramidal shapes may be created in a metal layer using a pulsed laser deposition technique. In a paper entitled "Formation of self-assembled epitaxial nickel nanostructure," Zhou et al., Journal of Applied Physics (JAPL) Volume 94, No. 8, October 2003, pp. 4841-4846, herein incorporated by reference, a layer of titanium nitride (TiN) and a second layer of nickel (Ni) were deposited by pulsed laser deposition (PLD) and the nickel upper layer, if deposition occurs at temperatures in the range of 400-650 degrees C., forms pyramidal nanostructures. These increased area structures may also be used for the bottom layer of the capacitor structure in this invention and the result will thereby increase the surface area of the capacitor plates, and hence, the effective capacitance obtained.

Following the nanoparticle or pyramid formation in the bottom layer, atomic layer deposition (ALD) may be used to conformally deposit a first conductive electrode of polysilicon, doped polysilicon, or metal. The first electrode may comprise a metal or refractory metal, for example, any one of many known metals and combinations may be used including TiN or TaN, Ta, TaSiN, TiW, NiCr, MoN, Ru, WN, WSi, Cu, Al, W, Ti, Co, N, Ni, Mo, other metals and combinations thereof. The first electrode layer 250 preferably comprises a thickness of about 50 to 1000 Angstroms, for example.

The conductive material layer 362 is a part of the bottom electrode of the MIM, a dielectric as described above using, for example, a high-k dielectric material or a combination of materials is next deposited. This layer may comprise high-k dielectrics such as $Ta_2O_5$, $La_2O_3$, $Al_2O_3$, or other known high-k dielectrics such as $HfO_2$, HfSiON and the like, including Al, Si, O, N, Ti, Ta, lead-zirconate-titanate (PZT), barium strontium titanate (BST), $Ta_2O_5$, $Al_2O_3$, $SiO_2$, other dielectric materials, or combinations thereof. Layer 363 is again conformal and follows the nanoparticle pattern of the bottom layer and preferably comprises a thickness of about 10 to 500 Angstroms, for example.

A second conductive electrode of polysilicon, doped polysilicon, or metal, 364, is also deposited by ALD and is conformal to the layers 363, 362 and 361. Typically, the first and second electrodes will be formed of the same or similar material. The second electrode will then be coupled, using contact, via and metallization as are known in the semiconductor art, to a plate voltage which may be a fixed voltage potential or a voltage developed on chip by known circuitry. Copper or aluminum metallization or damascene processes are used to complete the upper electrode, as described above. Also, the upper electrode will be coupled to a fixed plate voltage potential, and may be arranged to have a common connection with other capacitors in a certain area or form an array with a common upper electrode terminal.

FIG. 19 depicts the capacitors 341, 343 of FIG. 16 in cross-section in a close up view. Interlevel insulators 345, 343 are shown with conductive vias 371, 373 shown beneath the capacitors 341, 343 for coupling to the drain terminals of the access transistors (not shown). Metal layer 361 is a gold (Au) or other metal layer, for example, tungsten, titanium, palladium, platinum, silver, copper, nickel and other metals could be used as bottom layer 361. Following the deposition and the nanoparticle formation using the excimer laser approach, or alternatively the pyramidal nanostructure formation using pulsed laser deposition of the metal, a first electrode material 362 is deposited using, for example, atomic layer deposition (ALD) or other deposition means which forms a conformal layer over the nanoparticles, thereby achieving an increased surface area. Similarly, dielectric layer 363 is deposited over the first electrode 362 by ALD or other deposition means, and second electrode layer 364 is deposited and may fill entirely the remaining space within the recesses for capacitors 341, 343 to complete the capacitors.

A novel structure is formed in accordance with embodiments of the present invention. A logic region having one or more planar MOS transistors is provided in a substrate, which also includes a memory region with a MIM capacitor and at least one finFET transistor on the same substrate. Preferably, the access transistors in the memory region are finFET transistors. The MIM capacitors may include laser excimer irradiated layers forming nanoparticles for increased surface area and increased capacitance. A novel process for forming the structure of the invention is described using existing semiconductor processing techniques and existing photomasks, so that the invention may be used without expensive retooling. In other embodiments the capacitor may be used not as a memory element for data storage but as part of a filter, switched capacitor network, R-C network, analog to digital converter, or the like. The logic region and memory region combined may form the layout of a macro cell which incorporates at least one of the access finFET transistors and at least one capacitor in a 1-T RAM bit cell and also includes at least one of the CMOS logic transistors. Many more transistors may be formed as a single macro cell. An integrated circuit formed of many macro cells, including at least one macro cell incorporating at least one of the memory storage cells using the finFET access transistor and the MIM capacitor and at least one planar transistor as provided above, may be produced.

Although certain preferred embodiments of the present invention and their advantages have been described in detail, it should be understood that various changes, substitutions and alterations can be made herein without departing from the spirit and scope of the invention as defined by the appended claims. Moreover, the scope of the present application is not intended to be limited to the particular embodiments of circuits, structures, methods and steps described in the specification. Accordingly, the appended claims are intended to include within their scope those processes, machines, manufacture, compositions of matter, means, methods, or steps which utilize the invention and those variations and medications which utilize the invention that are apparent to those skilled in the art.

What is claimed is:

1. A semiconductor device, comprising:
    a semiconductor substrate;
    a first planar MOS transistor formed in a first region of the substrate;
    at least one finFET transistor formed in a second region of the substrate;
    shallow trench isolation regions formed between the first logic region and the second region;
    a first insulating layer formed over the substrate;
    a second insulating layer formed over the first insulating layer; and
    at least one MIM capacitor formed in the said second insulating layer.

2. The semiconductor device of claim 1, wherein the finFET transistor has one terminal electrically coupled to a first electrode of the at least one MIM capacitor, the finFET transistor and the at least one MIM capacitor thereby forming a storage cell in the second region.

3. The semiconductor device of claim 2, wherein the MIM capacitor further comprises a first electrode formed of a textured surface.

4. The semiconductor device of claim 3, wherein the MIM capacitor further comprises a first electrode formed of a hemispherical grained material.

5. The semiconductor device of claim 1, wherein the MIM capacitor comprises:

a first metal layer deposited in a recess in the second insulating layer and having nanoparticles;

a first electrode layer conformally deposited over the first metal layer, the first electrode layer comprising a conductive material;

a first dielectric layer conformally deposited over the first electrode layer, the first dielectric layer comprising a high dielectric material; and a second electrode conformally deposited over the first electrode layer, the second electrode comprising a conductive material and for receiving a voltage potential.

6. The semiconductor device of claim 1, wherein the finFET transistor comprises:

a first silicon fin formed of said substrate in a recess in said substrate and having sidewalls, and having source and drain regions including a semiconductor dopant;

a gate dielectric material deposited over the silicon fin and defining a channel region; and a gate electrode deposited over the silicon fin and formed to overly and intersect the silicon fin in the channel region, the gate electrode and the gate dielectric forming the gate region of a MOS transistor;

wherein the gate electrode and the gate dielectric material overly the sidewalls of the silicon fin and thereby form a multiple gate MOS transistor.

7. The semiconductor device of claim 6 wherein the finFET transistor further comprises gate electrode and gate dielectric material overlying the top surface of the silicon fin thereby forming a triple gate MOS transistor.

8. The semiconductor device of claim 7 wherein the finFET transistor is a p-type transistor and the transistor drain current flows along the 110 surface of the semiconductor substrate.

9. The semiconductor device of claim 8 wherein the finFET transistor is an n-type transistor and the transistor drain current flows along the 100 surface of the semiconductor substrate.

10. The semiconductor device of claim 1 wherein the planar transistor formed in said first logic region is formed of a strained semiconductor material deposited on said substrate.

11. The semiconductor device of claim 10 wherein the planar transistor formed in said first logic region is formed of a strained SiGe material.

12. The semiconductor device of claim 10 wherein the source and drain of the planar transistor are formed in a raised region formed above the surface of said substrate.

13. The semiconductor device of claim 1, wherein the planar MOS transistor formed in the logic region and the finFET transistor formed in the memory region and coupled together and form a macro cell.

14. An integrated circuit including a logic region and an embedded memory region, comprising:

a semiconductor substrate having shallow trench isolation regions formed within it containing an trench insulator;

at least one planar MOS transistor formed over said semiconductor substrate in a logic region, the logic region isolated from the embedded memory region by at least one shallow trench isolation region;

at least one finFET transistor formed on a silicon fin in the embedded memory region, the silicon fin being formed between two adjacent shallow trench isolation regions; and at least one metal-insulator-metal (MIM) capacitor formed in the memory region above the substrate, the at least one MIM capacitor comprising a first conductive layer, a dielectric layer disposed over the first conductive layer, and a second conductive layer formed over the dielectric layer, and wherein the first conductive layer is coupled to the finFET transistor.

15. The integrated circuit of claim 14, and further comprising a macro cell formed by coupling the at least one finFET transistor and at least one MIM capacitor together to form a first memory storage cell and coupling the memory storage cell to at least one planar transistor to form a macro cell.

16. An integrated circuit formed of a plurality of macro cells coupled together to perform a function, at least one of the macro cells comprising:

a semiconductor substrate having shallow trench isolation regions formed within it containing an trench insulator;

at least one planar MOS transistor formed over said semiconductor substrate in a logic region, the logic region isolated from the embedded memory region by at least one shallow trench isolation region;

at least one finFET transistor formed on a silicon fin in the embedded memory region, the silicon fin being formed between two adjacent shallow trench isolation regions; and at least one metal-insulator-metal (MIM) capacitor formed in the memory region above the substrate, the at least one MIM capacitor comprising a first conductive layer, a dielectric layer disposed over the first conductive layer, and a second conductive layer formed over the dielectric layer, and wherein the first conductive layer is coupled to the finFET transistor to form a memory storage cell; and one or more conductors formed coupling the at least one planar transistor to the at least one memory storage cell to form a circuit.

17. A semiconductor device, comprising:

a semiconductor substrate having one or more shallow trench isolation regions formed within it containing an trench insulator;

a plurality of planar MOS transistors formed over said semiconductor substrate in a logic region, the logic region isolated from an embedded memory region by at least one shallow trench isolation region;

a first insulating layer formed over the substrate;

a second insulating layer formed over the substrate; and a memory array formed in the embedded memory region, comprising:

plurality of 1 T RAM cells each formed from a finFET transistor having one of a source and drain region coupled to an associated MIM capacitor formed in the second insulating layer;

at least one word line formed of a conductive material overlying the substrate in the embedded memory region and coupled to the gates of two or more of the finFET transistors of two or more of the 1 T RAM cells; and at least one bit line formed of a conductive material overlying the substrate in the embedded memory region, isolated from the at least one word line by an insulating layer and coupled to one of the source and drain terminals of two or more of the finFET transistors of two or more of the 1 T RAM cells.

18. The semiconductor device of claim 17 wherein the at least one bit line and the at least one word line are arranged as conductors disposed in dielectric layers formed above the substrate in the embedded memory region.

19. The semiconductor device of claim 17, and further comprising at least one macro cell formed by coupling at least one of the plurality of 1 T RAM cells to at least one of the plurality of planar MOS transistors to form a circuit.

20. The semiconductor device of claim 17, wherein the MIM capacitors each further comprise a first electrode formed of a textured surface.

21. The semiconductor device of claim 17, wherein the MIM capacitors each further comprise a first electrode formed of a hemispherical grained material.

22. The semiconductor device of claim 17, wherein the MIM capacitors each further comprise:
   a first metal layer deposited in a recess in the second insulating layer and having nanoparticles;
   a first electrode layer conformally deposited over the first metal layer, the first electrode layer comprising a conductive material;
   a first dielectric layer conformally deposited over the first electrode layer, the first dielectric layer comprising a high-k dielectric material; and
   a second electrode conformally deposited over the first electrode layer, the second electrode comprising a conductive material and for receiving a voltage potential.

23. The semiconductor device of claim 17, wherein the finFET transistors each further comprise:
   a first silicon fin formed of said substrate in a recess in said substrate and having sidewalls, and having source and drain regions including a semiconductor dopant;
   a gate dielectric material deposited over the silicon fin and defining a channel region; and
   a gate electrode deposited over the silicon fin and formed to overly and intersect the silicon fin in the channel region, the gate electrode and the gate dielectric forming the gate region of a MOS transistor;
   wherein the gate electrode and the gate dielectric material overly the sidewalls of the silicon fin and thereby form a multiple gate MOS transistor.

24. The semiconductor device of claim 17 wherein the plurality of planer MOS transistors further comprise a transistor formed of strained semiconductor material deposited in the logic region of the substrate.

25. The semiconductor device of claim 24 where the strained semiconductor material is formed of a strained SiGe material.

26. The semiconductor device of claim 24 wherein the plurality of planar MOS transistors further comprise a source region and a drain region formed in a raised region disposed above the surface of the semiconductor substrate.

* * * * *

UNITED STATES PATENT AND TRADEMARK OFFICE
CERTIFICATE OF CORRECTION

PATENT NO. : 7,425,740 B2  Page 1 of 1
APPLICATION NO. : 11/246318
DATED : September 16, 2008
INVENTOR(S) : Liu et al.

It is certified that error appears in the above-identified patent and that said Letters Patent is hereby corrected as shown below:

On the Title Page, Section (56) References Cited, OTHER PUBLICATIONS, 1st entry, delete "AlTaO$_x$" and insert --AlTaO$_x$--.
On the Title Page, Section (56) References Cited, OTHER PUBLICATIONS, page 2, col. 1, 1st entry, delete "Pattering" and insert --Patterning--.
On the Title Page, Section (56) References Cited, OTHER PUBLICATIONS, page 2, col. 1, 1st entry, delete "Naoparticles" and insert --Nanoparticles--.
In Col. 16, line 19, delete "maybe" and insert --may be--.
In Col. 16, line 40, delete "overly" and insert --overlie--.
In Col. 17, line 32, delete "finFET's" and insert --finFETs--.
In Col. 18, line 11, delete "finFET's" and insert --finFETs--.
In Col. 18, line 63, delete "manometers" and insert --nanometers--.
In Col. 20, lines 38-39, delete "medications" and insert --alterations--.
In Col. 21, line 21, delete "overly" and insert --overlie--.
In Col. 21, line 25, delete "overly" and insert --overlie--.
In Col. 24, line 4, delete "overly" and insert --overlie--.
In Col. 24, line 8, delete "overly" and insert --overlie--.
In Col. 24, line 12, delete "planer" and insert --planar--.

Signed and Sealed this

Second Day of December, 2008

JON W. DUDAS
*Director of the United States Patent and Trademark Office*